US010957765B2

(12) United States Patent
Park et al.

(10) Patent No.: US 10,957,765 B2
(45) Date of Patent: Mar. 23, 2021

(54) SEMICONDUCTOR DEVICES HAVING POWER RAILS

(71) Applicant: Samsung Electronics Co., Ltd., Suwon-si (KR)

(72) Inventors: Pan-Jae Park, Seongnam-si (KR); Jae-Seok Yang, Hwaseong-si (KR); Young-Hun Kim, Seoul (KR); Hae-Wang Lee, Yongin-si (KR); Kwan-Young Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/051,667

(22) Filed: Aug. 1, 2018

(65) Prior Publication Data

US 2019/0123140 A1 Apr. 25, 2019

(30) Foreign Application Priority Data

Oct. 19, 2017 (KR) ........................ 10-2017-0135748

(51) Int. Cl.

*H01L 29/08* (2006.01)
*H01L 27/088* (2006.01)

(Continued)

(52) U.S. Cl.

CPC .. *H01L 29/0847* (2013.01); *H01L 21/823418* (2013.01); *H01L 21/823431* (2013.01); *H01L 21/823437* (2013.01); *H01L 21/823475* (2013.01); *H01L 21/823481* (2013.01); *H01L 27/0207* (2013.01); *H01L 27/088* (2013.01); *H01L 27/0886* (2013.01);

(Continued)

(58) Field of Classification Search

CPC ........... H01L 27/0207; H01L 27/11807; H01L 27/0924; H01L 27/02–0211; H01L 2027/11875; H01L 2027/11881

See application file for complete search history.

(56) References Cited

U.S. PATENT DOCUMENTS 9,547,741 B2 1/2017 Schroeder
9,634,003 B2 4/2017 Jain et al.

(Continued)

FOREIGN PATENT DOCUMENTS

KR 10-2016-0028991 A 3/2016
KR 10-2016-0118450 A 10/2016
KR 10-2017-0021743 A 2/2017

*Primary Examiner* — Stephen M Bradley
(74) *Attorney, Agent, or Firm* — Sughrue Mion, PLLC

(57) ABSTRACT

A semiconductor device is provided including a substrate, a first gate structure, a first contact plug and a power rail. The substrate includes first and second cell regions extending in a first direction, and a power rail region connected to each of opposite ends of the first and second cell regions in a second direction. The first gate structure extends in the second direction from a boundary area between the first and second cell regions to the power rail region. The first contact plug is formed on the power rail region, and contacts an upper surface of the first gate structure. The power rail extends in the first direction on the power rail region, and is electrically connected to the first contact plug. The power rail supplies a turn-off signal to the first gate structure through the first contact plug to electrically insulate the first and second cell regions.

17 Claims, 43 Drawing Sheets

(51) Int. Cl.

| | |
|---|---|
| ***H01L 27/02*** | (2006.01) |
| ***H01L 27/118*** | (2006.01) |
| ***H01L 27/092*** | (2006.01) |
| ***H01L 21/8234*** | (2006.01) |
| ***H01L 29/78*** | (2006.01) |
| ***H01L 29/66*** | (2006.01) |
| *H01L 21/8238* | (2006.01) |

(52) U.S. Cl.

CPC .. *H01L 27/11807* (2013.01); *H01L 29/66545* (2013.01); *H01L 29/7848* (2013.01); *H01L 29/7851* (2013.01); *H01L 21/823828* (2013.01); *H01L 21/823871* (2013.01); *H01L 21/823878* (2013.01); *H01L 27/092* (2013.01); *H01L 2027/11875* (2013.01); *H01L 2027/11881* (2013.01)

(56) References Cited

U.S. PATENT DOCUMENTS

| | | | | |
|---|---|---|---|---|
| 9,793,387 | B2 | 10/2017 | Hutzler et al. | |
| 2014/0264597 | A1* | 9/2014 | Kim | H01L 21/76224 257/347 |
| 2015/0132909 | A1* | 5/2015 | Choi | H01L 29/7851 438/283 |
| 2015/0311122 | A1 | 10/2015 | Rashed et al. | |
| 2016/0063166 | A1* | 3/2016 | Hsieh | G06F 30/398 257/774 |
| 2016/0064379 | A1* | 3/2016 | Yu | H01L 21/0223 257/192 |
| 2016/0071848 | A1 | 3/2016 | Sengupta et al. | |
| 2016/0293608 | A1 | 10/2016 | Yoon | |
| 2016/0336183 | A1* | 11/2016 | Yuan | H01L 29/66795 |
| 2017/0200726 | A1* | 7/2017 | Tsuda | H01L 29/42344 |

* cited by examiner

PMOS
NMOS
420
462
464
344
342
426
372
422
282
284
428
X
424
374
CR1
CR2
I
II 430
390
380
300
290
220
182
105a
105
105b
120
100
A'
I
II
272
242
252
262
282
462
452
442
372
362
352
220
182
A
3RD DIRECTION
2ND DIRECTION
1ST DIRECTION 430
390
380
300
290
220
210
105a
105b
105
120
100
D'
D
342
332 322
464
444 454
225
225
190
190
312
462
452
442
426
416
406
I
II
3RD DIRECTION
2ND DIRECTION
1ST DIRECTION 162
152
142
172
200
105a
105b
105
100
182
184
164
154
144
174
C
C'
CR1
CR2
I
3RD DIRECTION
1ST DIRECTION
2ND DIRECTION 162
152
142
172
210
105a
105
105b
100
C'
182
210
184
164
154
144
174
210
C
CR2
CR1
I
3RD DIRECTION
1ST DIRECTION
2ND DIRECTION 220
182
210
105a
105
105b
100
C'
272
242
252
262
282
210
274
244
254
264
284
184
210
C
CR2
CR1
I
3RD DIRECTION
1ST DIRECTION
2ND DIRECTION 105
290
220
182
105a
105b
120
100
A'
272
242
252
262
282
I
II
300
362
352
372
220
182
A
3RD DIRECTION
2ND DIRECTION
1ST DIRECTION 105
105a
105b
290
220
182
120
100
A'
A
I
II
272
242
252
262
282
300
372
362
352
3RD DIRECTION
2ND DIRECTION
1ST DIRECTION 320
290
120
100
B'
B
332 322
342
372
362 352
252
262
272
254
264
274
184
II
3RD DIRECTION
1ST DIRECTION
2ND DIRECTION 342
332 322
300
290
220
210
105a
105
105b
120
100
D'
225
225
190
190
312
D
I
II
3RD DIRECTION
2ND DIRECTION
1ST DIRECTION 426
406 416
422
402 412
362
352
372
290
120
100
B'
B
322
332
342
252
262
272
254
264
274
184
390
380
320
II
3RD DIRECTION
1ST DIRECTION
2ND DIRECTION 390
380
300
290
220
312
210
105a
105b
105
100
C'
C
342
332 322
428
408 418
344
334
324
314
184
210
312
272
242
252
262
282
274
244
254
264
284
CR2
CR1
I
3RD DIRECTION
1ST DIRECTION
2ND DIRECTION 390
380
300
290
220
210
105a
105b
105
120
100
D'
D
342
332 322
426
406 416
225
225
190
190
312
I
II
3RD DIRECTION
2ND DIRECTION
1ST DIRECTION

PMOS
NMOS
420
462
462
344
342
426
372
422
342
426
284
344
428
284
424
374
CR2
CR1
II
I
II

SEMICONDUCTOR DEVICES HAVING POWER RAILS

CROSS-REFERENCE TO RELATED APPLICATION

This application claims priority under 35 USC § 119 to Korean Patent Application No. 10-2017-0135748, filed on Oct. 19, 2017 in the Korean Intellectual Property Office (KIPO), the contents of which are hereby incorporated herein by reference in its entirety.

FIELD

The present inventive concept relates generally to semiconductor devices and, more particularly to, semiconductor devices having power rails.

BACKGROUND

In order to electrically isolate neighboring standard cells of a semiconductor device, gate structures at a boundary area between the standard cells may be removed. During this process stress applied to source/drain layers adjacent the gate structures may be weakened. If one gate structure is formed at an edge of each of neighboring standard cells and removed, the integration degree of the semiconductor device may decrease due to the areas of the gate structures.

SUMMARY

Some embodiments of the present inventive concept provide a semiconductor device including a substrate, a first gate structure, a first contact plug, and a power rail. The substrate may include first and second cell regions and a power rail region, the first and second cell regions may be disposed in a first direction, and the power rail region may be connected to each of opposite ends of the first and second cell regions in a second direction substantially perpendicular to the first direction. The first gate structure may extend in the second direction on the substrate from a boundary area between the first and second cell regions to the power rail region. The first contact plug may be formed on the power rail region of the substrate, and contact an upper surface of the first gate structure. The power rail may extend in the first direction on the power rail region of the substrate, and may be electrically connected to the first contact plug. The power rail may supply a turn-off signal to the first gate structure through the first contact plug so as to electrically insulate the first and second cell regions from each other.

Further embodiments of the present inventive concept provide a semiconductor including a substrate, an active fin, a first gate structure, a first contact plug, and a power rail. The substrate may include first and second cell regions and a power rail region, the first and second cell regions may be disposed in a first direction, and the power rail region may be connected to each of opposite ends of the first and second cell regions in a second direction substantially perpendicular to the first direction. The active fin may continuously extend in the first direction on the substrate from at least a portion of the first cell region to at least a portion of the second cell region. The active fin may include a first portion on the first cell region and a second portion on the second cell region. The first gate structure may extend in the second direction on the substrate from a boundary area between the first and second cell regions to the power rail region. The first contact plug may be formed on the power rail region of the substrate, and contact an upper surface of the first gate structure. The power rail may extend in the first direction on the power rail region of the substrate, and may be electrically connected to the first contact plug. The power rail may supply a turn-off signal to the first gate structure through the first contact plug so as to electrically insulate the first and second portions of the active fin from each other.

Still further embodiments of the present inventive concept provide a semiconductor device including a substrate, first and second gate structures, first and second contact plugs, a first power rail, and a second power rail. The substrate may include first and second power rail regions and first and second cell regions, each of the first and second power regions may extend in a first direction, the first and second power rail regions may be spaced apart from each other in a second direction substantially perpendicular to the first direction, and the first and second cell regions may be disposed between the first and second power rail regions and contacting each other in the first direction. The first and second gate structures may be spaced apart from each other, and each of the first and second gate structures may extend in the second direction on the substrate from a boundary area between the first and second cell regions to the first and second power rail regions, respectively. The first and second contact plugs may be forming on the first and second power rail regions, respectively, of the substrate, and the first and second contact plugs may contact upper surfaces of the first and second gate structures, respectively. The first power rail may extend in the first direction on the first power rail region of the substrate, and the first power rail may be electrically connected to the first contact plug and supply a plus voltage to the first gate structure through the first contact plug. The second power rail may extend in the first direction on the second power rail region of the substrate, and the second power rail may be electrically connected to the second contact plug and supply a ground voltage or a minus voltage to the second gate structure through the second contact plug. The first and second cell regions may be electrically insulated from each other.

In some embodiments, the neighboring cell regions may be effectively insulated from each other even with a high integration degree.

DESCRIPTION OF EMBODIMENTS

Figure 1A:
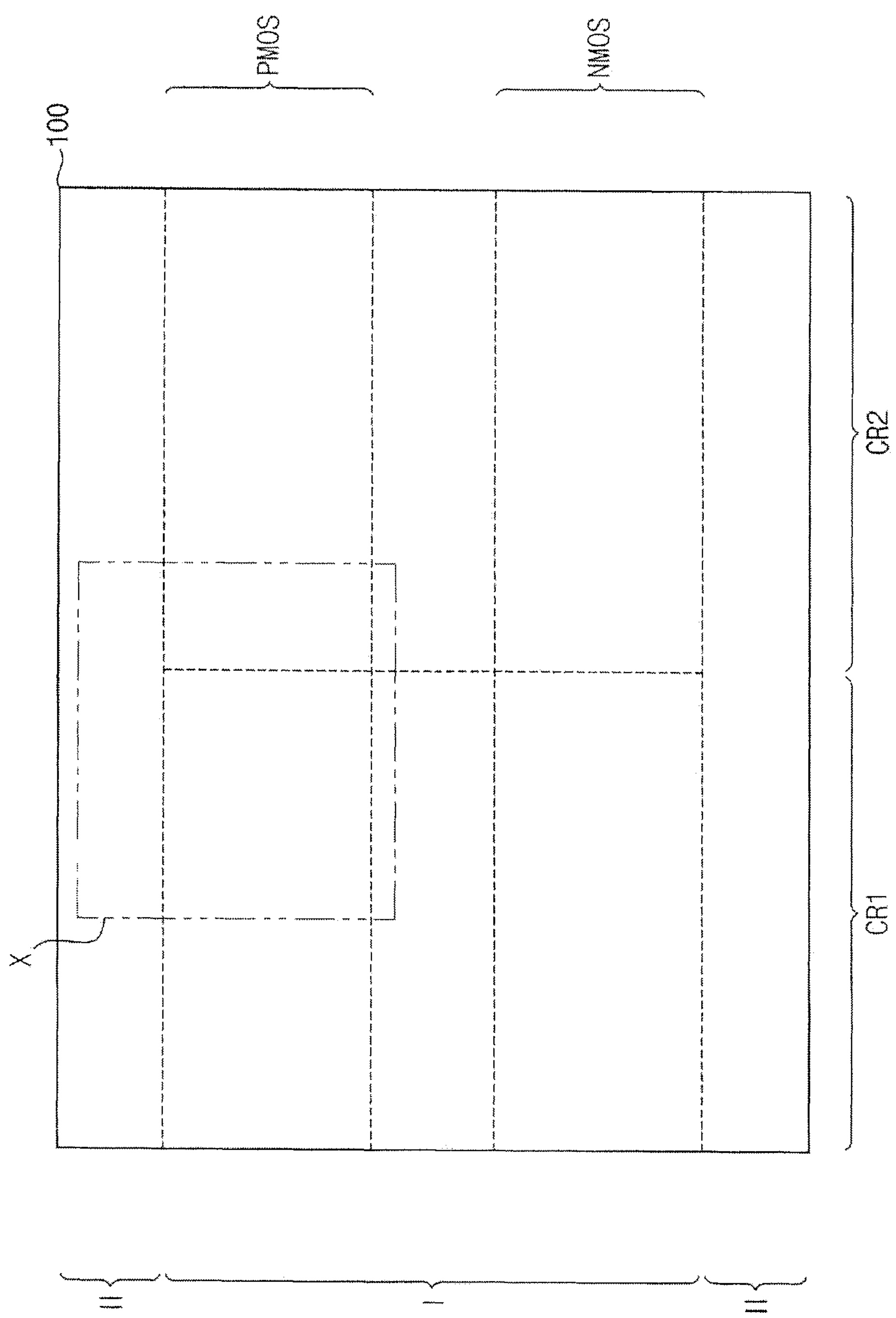
FIGS. 1A to 6 are plan views and cross-sections illustrating a semiconductor device in accordance with some embodiments of the present inventive concept.
Figure 1B:
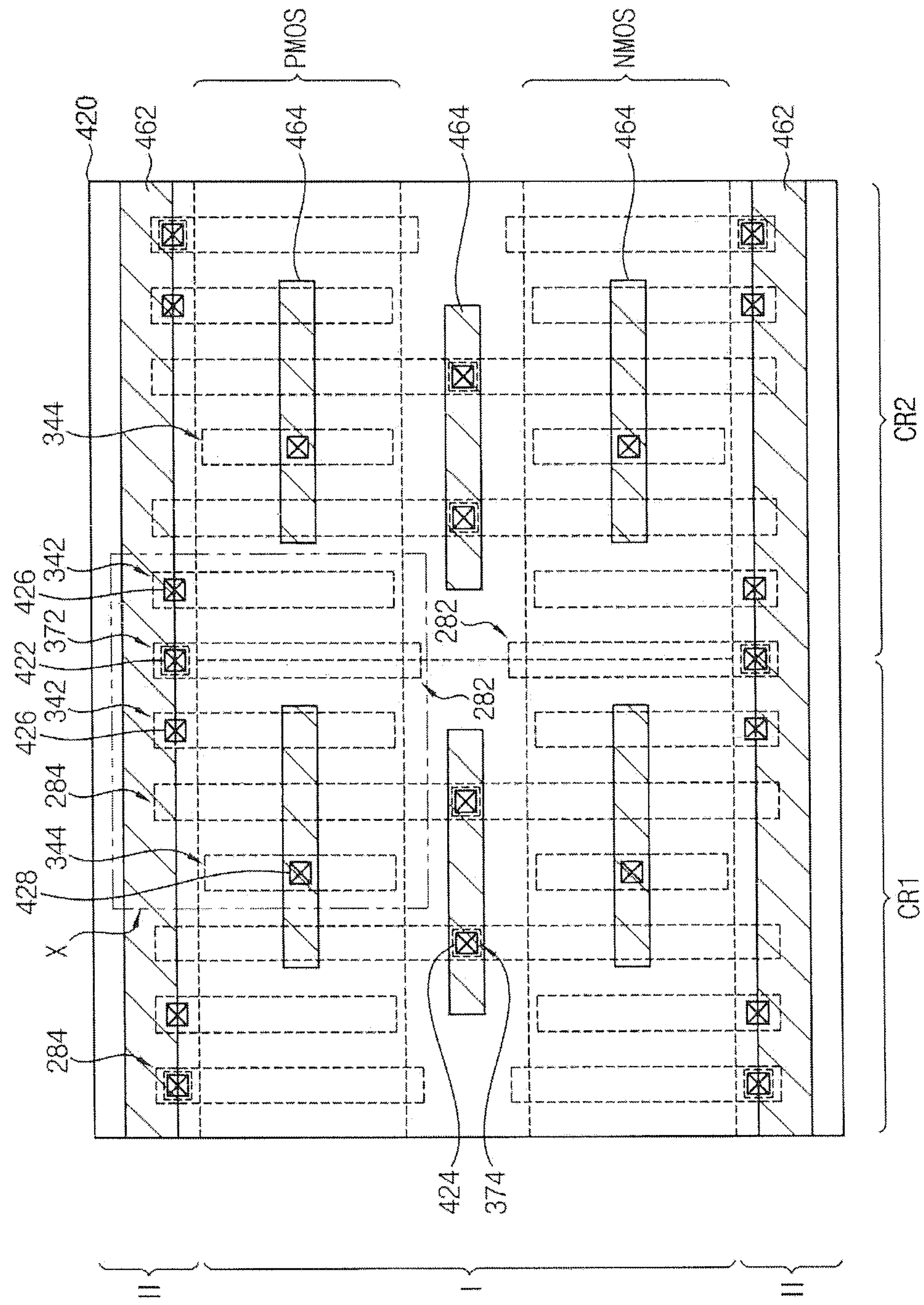
Figure 2:
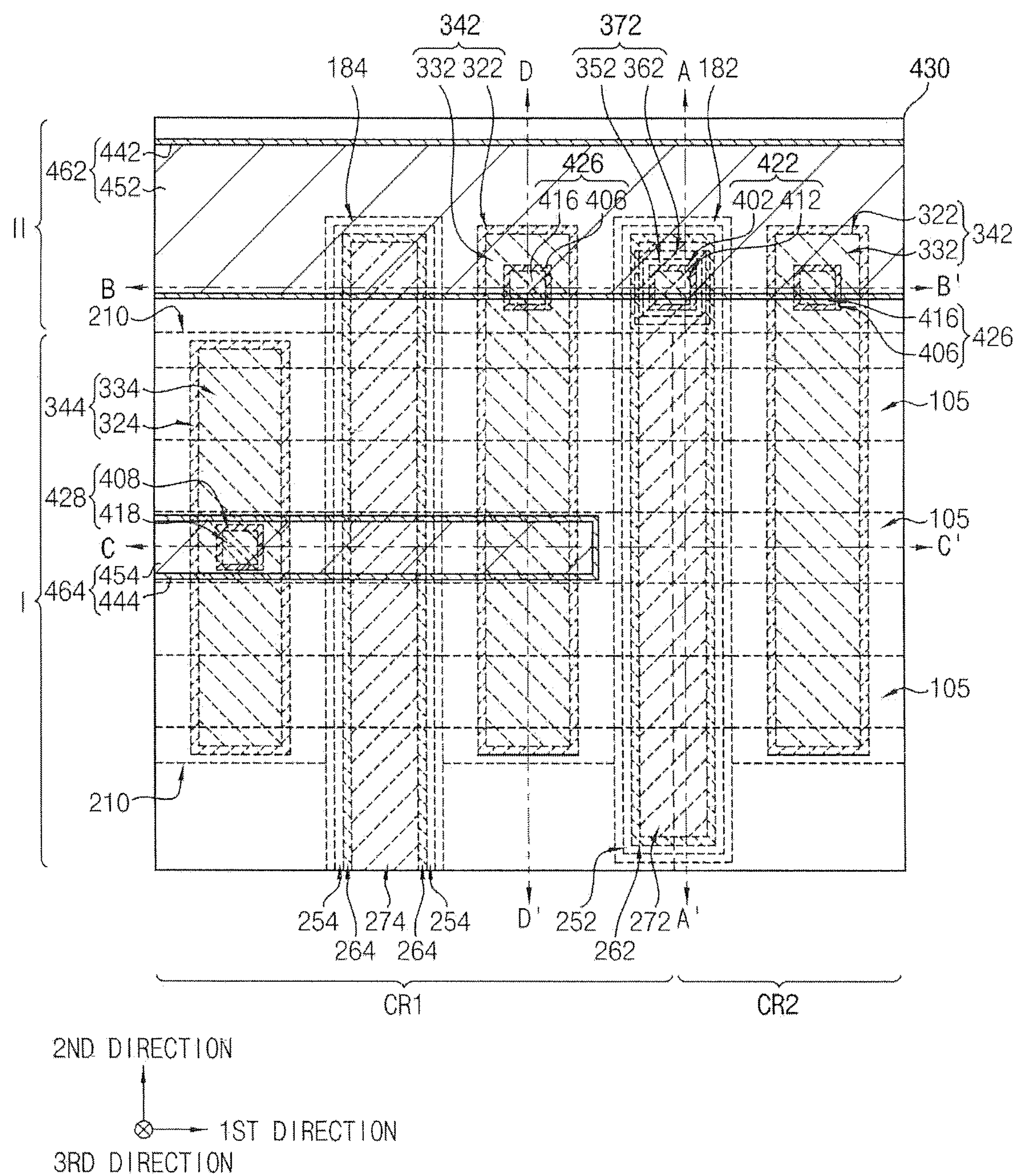

FIGS. 1A to 6 are plan views or cross-sections illustrating a semiconductor device in accordance with some embodiments of the present inventive concept. FIGS. 1A, 1B and 2 are the plan views, and FIGS. 3A to 6 are the cross-sections. Particularly, FIGS. 3A to 6 are cross-sections taken along lines A-A', B-B', C-C' and D-D', respectively, of FIG. 2.

FIG. 1A is a plan view illustrating regions of the substrate, FIG. 1B is a plan view illustrating a layout of main elements of the semiconductor device, and FIG. 2 is an enlarged plan view of a region X of FIG. 1B. FIG. 1B shows only the layout of gate structures, contact plugs, vias, power rails, and wirings, so as to avoid the complexity of the figure.

Referring first to FIG. 1A, the semiconductor device may be formed on a substrate 100 including first and second regions I and II. The substrate 100 may include a semiconductor material, for example, silicon, germanium, silicon-germanium, and the like, or III-V semiconductor compounds, for example, GaP, GaAs, GaSb, and the like. In some embodiments, the substrate 100 may be a silicon-on-insulator (SOI) substrate or a germanium-on-insulator (GOI) substrate.

In some embodiments, the first region I may be a cell region in which cells may be formed, and the second region II may be a power rail region in which power rails for applying various voltages, for example, source voltage, drain voltage, ground voltage, and the like to the cells may be formed. In some embodiments, the second region II may extend in the first direction, and a plurality of second regions II may be formed to be spaced apart from each other in the second direction.

The first region I may be disposed between the second regions II to be connected thereto. In other words, each of opposite ends of the first region I in the second direction may be connected to the second region II. In some embodiments, the first region I may include a plurality of cell regions disposed in the first direction to be connected thereto. In the figure, the first region I includes only cell regions, i.e., first and second cell regions CR1 and CR2, however, the inventive concept may not be limited thereto. Hereinafter, the first and second regions I and II may be defined to include not only portions of the substrate 100 but also upper and lower spaces corresponding thereto.

In some embodiments, the first region I may include a PMOS region and an NMOS region, which may be spaced apart from each other in the second direction.

Referring to FIGS. 1B, 2, 3A, and 4 to 6, the semiconductor device may include an active fin 105, first and second gate structures 282 and 284, an impurity layer 210, first to fourth contact plugs 372, 374, 342 and 344, first to fourth vias 422, 424, 426 and 428, a power rail 462, and a wiring 464.

The semiconductor device may further include an isolation pattern 120, first to fourth insulating interlayers 220, 300, 390 and 430, a capping layer 290, an etch stop layer 380, first and second gate spacers 182 and 184, a fin spacer 190, and first and second metal silicide patterns 312 and 314.

The active fin 105 may be formed by partially removing an upper portion of the substrate 100, and thus may include substantially the same material as that of the substrate 100. The active fin 105 may extend in the first direction in the first region I, and a plurality of active fins 105 may be formed in the second direction.

The isolation pattern 120 may be formed on the substrate 100, and may cover a lower sidewall of each active fin 105. Thus, the active fin 105 may include a lower active pattern 105*b* of which a sidewall may be covered by the isolation pattern 120 and an upper active pattern 105*a* protruding from an upper surface of the isolation pattern 120. The isolation pattern 120 may include an oxide, for example, silicon oxide.

In some embodiments, each of the PMOS and NMOS regions may include an active region having one or a plurality of active fins 105, and the PMOS and NMOS regions may be separated from each other by a portion of the isolation pattern 120 at a central portion of the first region I in the second direction.

In the figures, each active fin 105 extends over opposite ends of the first region I in the first direction; however, the inventive concept may not be limited thereto. Thus, the active fin 105 may be divided into a plurality of pieces in the first direction in the first region I.

In some embodiments, at least one of the active fins 105 may continuously extend in the first direction from at least a portion of the first cell region CR1 to at least a portion of the second cell region CR2. In other words, at least one of the active fins 105 may continuously extend over portions of the first and second cell regions CR1 and CR2 at opposite sides of a boundary between the first and second cell regions CR1 and CR2.

In the figures, the PMOS region includes three active fins 105; however, the inventive concept may not be limited thereto. Thus, each of the PMOS and NMOS regions may include one or a plurality of active fins 105.

The first gate structure 282 may extend in the second direction from a boundary area between neighboring cell regions, for example, from the boundary area between the first and second cell regions CR1 and CR2 to one second region II on the active fins 105 and the isolation pattern 120. In some embodiments, one first gate structure 282 may extend in the second direction from the boundary area between the first and second cell regions CR1 and CR2 to one second region II in the PMOS region, and another one first gate structure 282 may extend in the second direction from the boundary area between the first and second cell regions CR1 and CR2 to one second region II in the NMOS region. The above two first gate structures 282 may be spaced apart from each other in the second direction.

A plurality of second gate structures 284 may be spaced apart from each other in the first direction. Ones of the second gate structures 284 may extend over the first region I and two second regions II adjacent thereto on the active fins 105 and the isolation pattern 120, and other ones of the second gate structures 284 may extend over a portion of the first region I and one second region II adjacent thereto on the active fins 105 and the isolation pattern 120.

The first gate structure 282 may include a first interface pattern 242, a first gate insulation pattern 252, a first workfunction control pattern 262 and a first gate electrode 272 sequentially stacked, and the second gate structure 274 may include a second interface pattern 244, a second gate insulation pattern 254, a second workfunction control pattern 264 and a second gate electrode 274 sequentially stacked.

The first and second interface patterns 242 and 244 may include an oxide, for example, silicon oxide, the first and second gate insulation patterns 252 and 254 may include a metal oxide having a high dielectric constant, for example, hafnium oxide, tantalum oxide, zirconium oxide, or the like, the first and second workfunction control patterns 262 and 264 may include a metal nitride or a metal alloy, for example, titanium nitride, titanium aluminum, titanium aluminum nitride, tantalum nitride, tantalum aluminum nitride, and the like, and the first and second gate electrodes 272 and 274 may include a metal having a low resistance, for example, aluminum, copper, tantalum, and the like, or a nitride thereof.

The first and second gate spacers 182 and 184 may be formed on sidewalls of the first and second gate structures 282 and 284, respectively, and the fin spacer 190 may be formed on a sidewall of the active fin 105. The first and second gate spacers 182 and 184 and the fin spacer 190 may include a nitride, for example, silicon nitride, silicon oxycarbonitride, and the like The impurity layer 210 may fill a third recess on the active fins 105 adjacent the first and second gate structures 282 and 284, and an upper portion of the impurity layer 210 may contact the first and second gate spacers 182 and 184. The impurity layer 210 may have a cross-section taken along the second direction having a shape of pentagon or hexagon. When the distance between neighboring active fins 105 is small, the impurity layers 210 growing on the neighboring active fins 105 may be merged with each other to form a single layer. In the figures, one impurity layer 210 grown from neighboring three active fins 105 to be merged with each other is shown; however, the inventive concept may not be limited thereto.

In some embodiments, the impurity layer 210 in the PMOS region may include a single crystalline silicon-germanium layer doped with p-type impurities, and may serve as a source/drain layer of a PMOS transistor including the second gate structure 284.

The impurity layer 210 in the NMOS region may include a single crystalline silicon carbide layer or a single crystalline silicon doped with n-type impurities, and may serve as a source/drain layer of an NMOS transistor including the second gate structure 284.

The first insulating interlayer 220 may be formed on the active fins 105 and the isolation pattern 120 to cover outer sidewalls of the first and second gate spacers 182 and 184. The first insulating interlayer 220 may not fill a space between the merged impurity layer 210 and the isolation pattern 120, and thus an air gap 225 may be formed. The first insulating interlayer 220 may include an oxide, for example, silicon oxide.

The capping layer 290 and the second insulating interlayer 300 may be sequentially stacked on the first insulating interlayer 220, the first and second gate structures 282 and 284, and the first and second gate spacers 182 and 184. The capping layer 290 may include a nitride, for example, silicon nitride, and the second insulating interlayer 300 may include an oxide, for example, silicon oxide.

The first and second contact plugs 372 and 374 may extend through the second insulating interlayer 300 and the capping layer 290 to contact upper surfaces of the first and second gate structures 282 and 284, respectively, and the third and fourth contact plugs 342 and 344 may extend through the first and second insulating interlayers 220 and 300 and the capping layer 290 to contact an upper surface of the impurity layer 210.

The third contact plug 342 may contact not only the upper surface of the impurity layer 210 in the first region I but also the upper surface of the isolation pattern 120 adjacent thereto in the second region II. The fourth contact plug 344 may contact only the upper surface of the impurity layer 210 in the first region I.

The first and second metal silicide patterns 312 and 314 may be formed between the impurity layers 210 and the third and fourth contact plugs 342 and 344, respectively. The first and second metal silicide patterns 312 and 314 may include a metal silicide, for example, cobalt silicide, nickel silicide, titanium silicide, and the like.

Figure 3A:
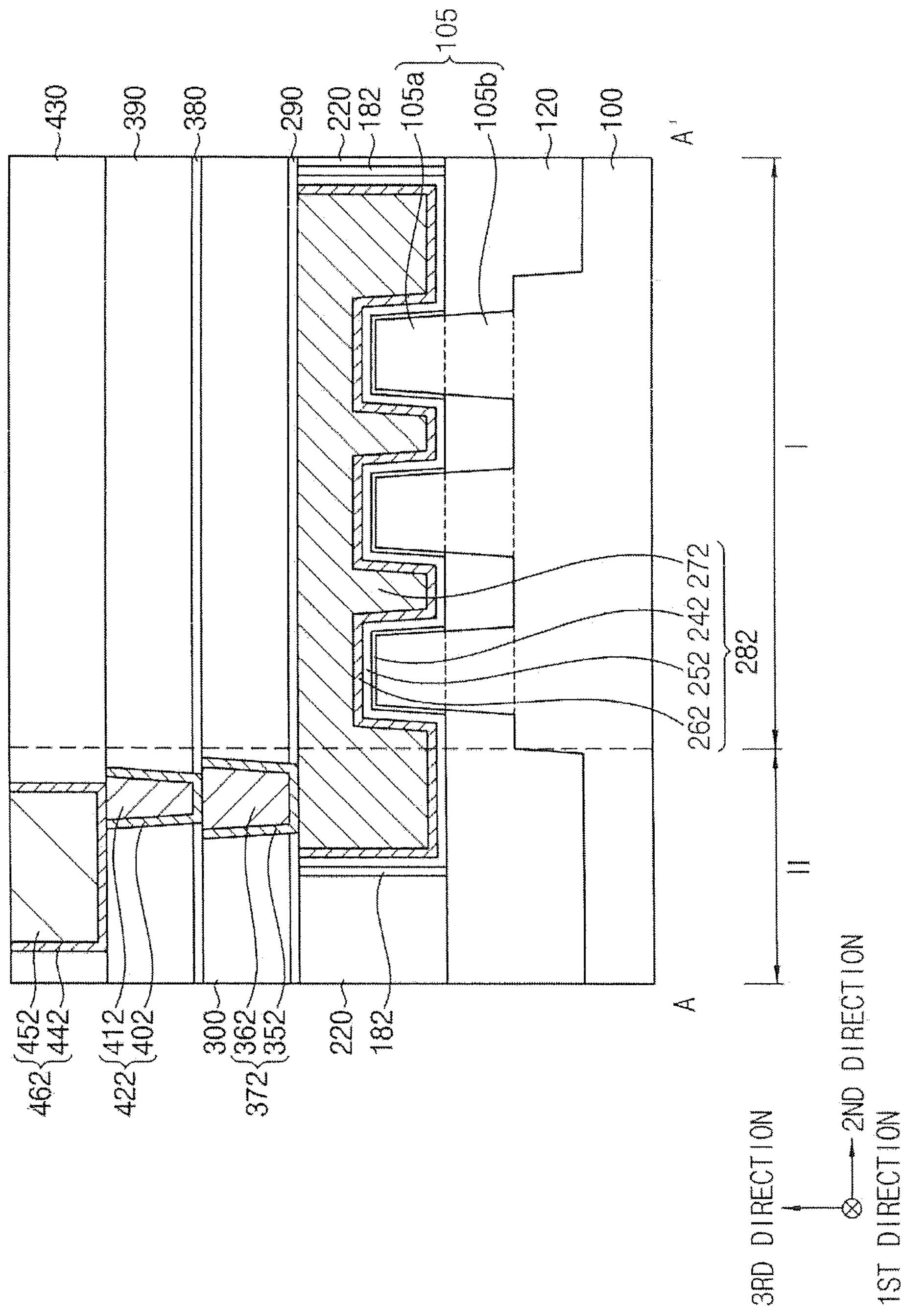
Figure 3B:
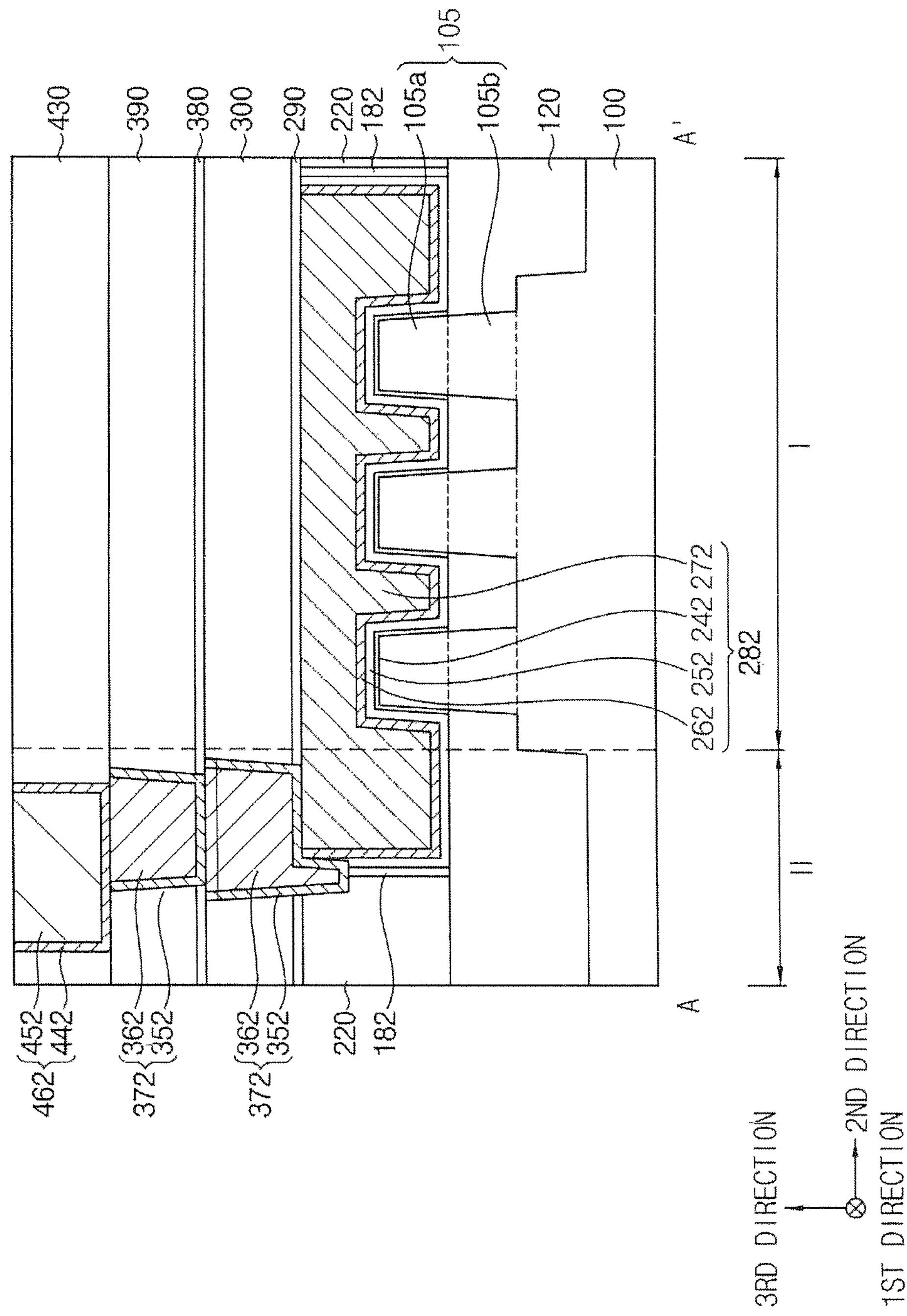
Figure 4:
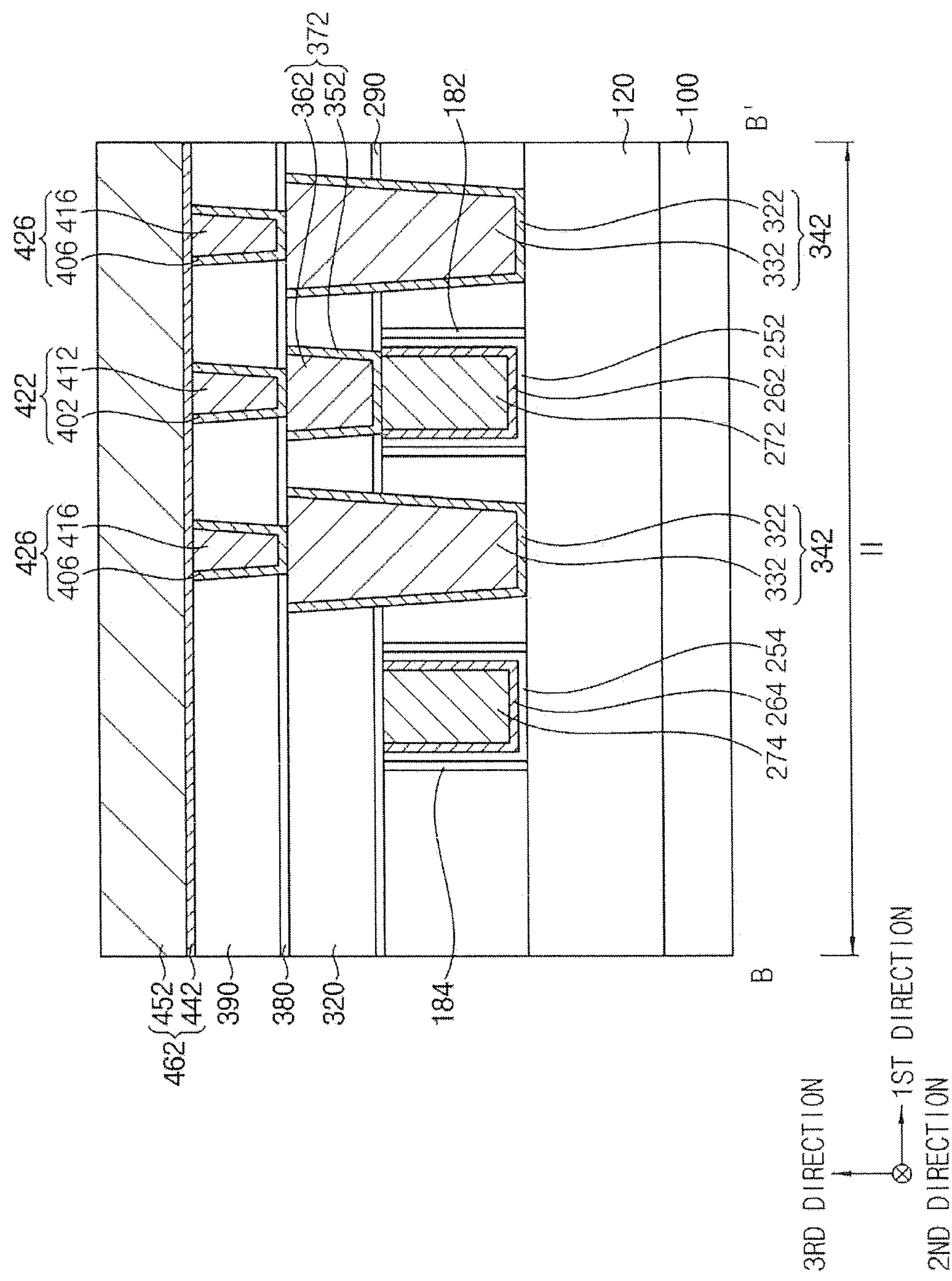
Figure 5:
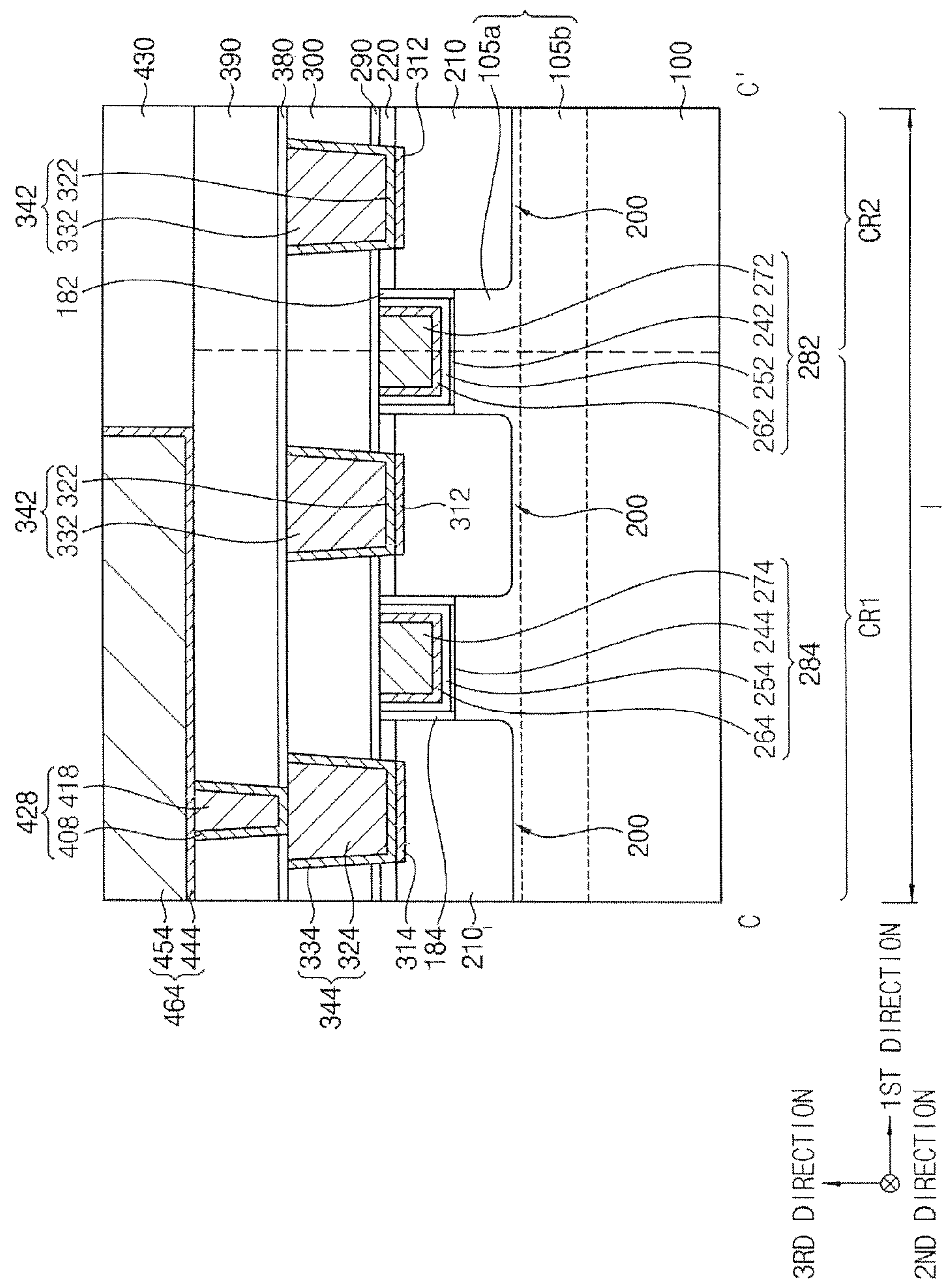
Figure 6:
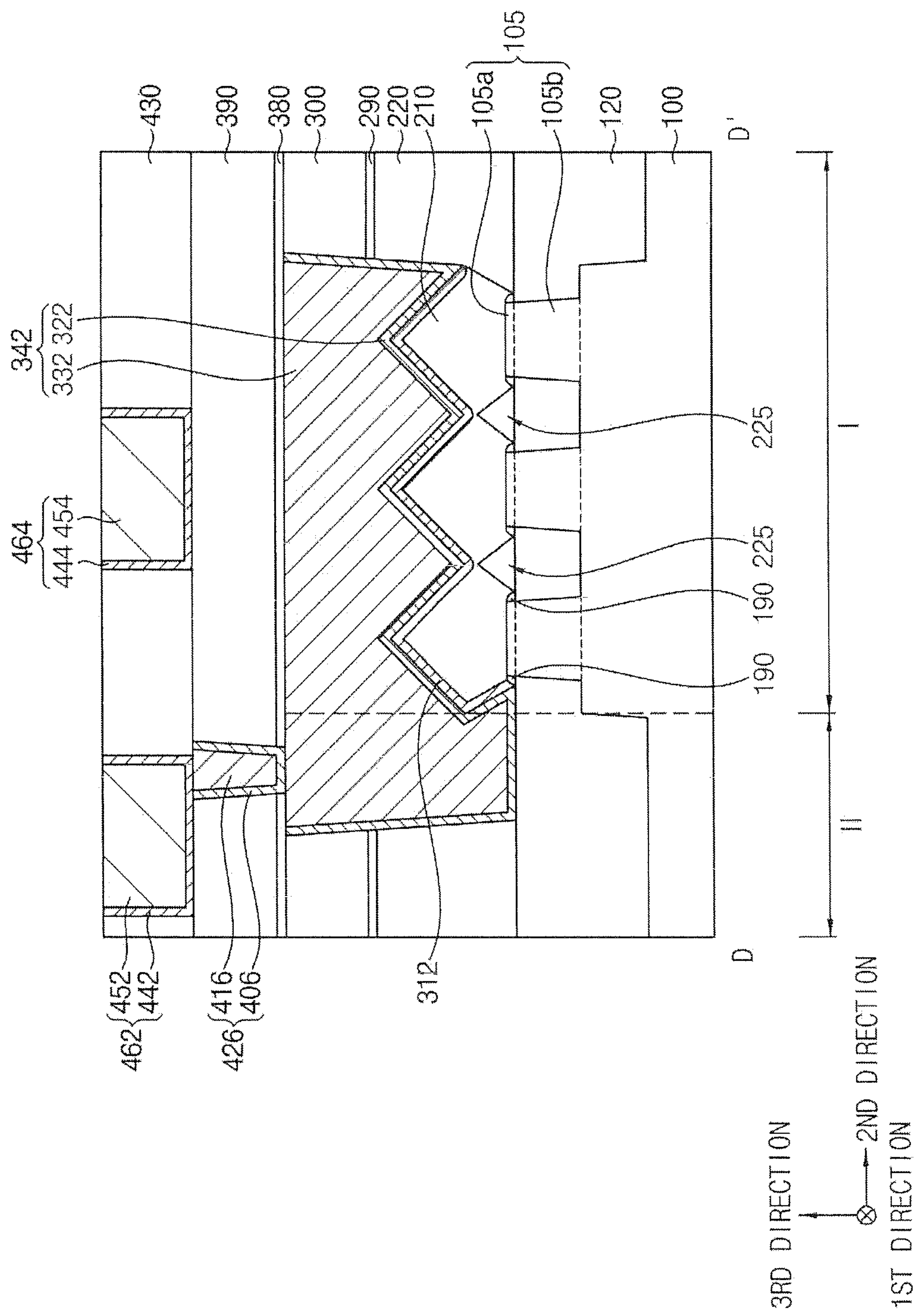

Referring to FIG. 3B, the first contact plug 372 may contact a sidewall of an end of the first gate structure 282 in the second region II.

The first contact plug 372 may include a first barrier pattern 352 and a first conductive pattern 362 sequentially stacked, the second contact plug 374 may include a second barrier pattern (not shown) and a second conductive pattern (not shown) sequentially stacked, the third contact plug 342 may include a third barrier pattern 322 and a third conductive pattern 332 sequentially stacked, and the fourth contact plug 344 may include a fourth barrier pattern 324 and a fourth conductive pattern 334 sequentially stacked.

In the figures, each of the third and fourth contact plugs 342 and 344 contacts a central upper surface of the impurity layer 210 in the first direction, however, the inventive concept may not be limited thereto. In some embodiments, each of the third and fourth contact plugs 342 and 344 may be self-aligned with the first and second gate spacers 182 and 184 on sidewalls of the first and second gate structures 282 and 284, respectively, or may be self-aligned with the second gate spacers 184 on sidewalls of the second gate structures 284, respectively.

The etch stop layer 380 and the third insulating interlayer 390 may be sequentially stacked on the second insulating interlayer 300 and the first to fourth contact plugs 372, 374, 342 and 344. The etch stop layer 380 may include a nitride, for example, silicon nitride, silicon carbonitride, silicon oxycarbonitride, and the like, the third insulating interlayer 390 may include, for example, silicon oxide. Alternatively, the third insulating interlayer 390 may include a low-k dielectric material, for example, silicon oxide doped with carbon (SiCOH) or silicon oxide doped with fluorine ($F—SiO_2$), a porous silicon oxide, spin on organic polymer, or an inorganic polymer, for example, hydrogen silsesquioxane (HSSQ), methyl silsesquioxane (MSSQ), and the like The first to fourth vias 422, 424, 426 and 428 may extend through the etch stop layer 380 and the third insulating interlayer 390 to contact upper surfaces of the first to fourth contact plugs 372, 374, 342 and 344, respectively. The first and third vias 422 and 426 may be formed in the second region II, and the second and fourth vias 424 and 428 may be formed in the first region I.

The first via 422 may include a fifth barrier pattern 402 and a fifth conductive pattern 412 sequentially stacked, the second via 424 may include a sixth barrier pattern (not shown) and a sixth conductive pattern (not shown) sequentially stacked, the third via 426 may include a seventh barrier pattern 406 and a seventh conductive pattern 416 sequentially stacked, and the fourth via 428 may include an eighth barrier pattern 408 and an eighth conductive pattern 418 sequentially stacked.

The fourth insulating interlayer 430 may be formed on the third insulating interlayer 390 and the first to fourth vias 422, 424, 426 and 428. The power rail 462 may extend through the fourth insulating interlayer 430 to commonly contact upper surfaces of the first and third vias 422 and 426, and the wiring 464 may extend through the fourth insulating interlayer 430 to contact an upper surface of the second via 424 or the fourth via 428.

The power rail 462 may include a ninth barrier pattern 442 and a ninth conductive pattern 452 sequentially stacked, and the wiring 464 may include a tenth barrier pattern 444 and a tenth conductive pattern 454 sequentially stacked. In some embodiments, the power rail 462 may extend in the first direction in the second region II, and the wiring 464 may extend in the first direction in the first region I.

In some embodiments, the power rail 462 in a portion of the second region II adjacent the PMOS region of the first region I may supply a plus voltage, for example, a drain voltage Vdd, the power rail 462 in a portion of the second region II adjacent the NMOS region of the first region I may supply a minus voltage or a ground voltage, for example, a source voltage Vss.

The first gate structure 282 that may be formed in the PMOS region of the first region I and supplied with a plus voltage from the power rail 462 through the first via 422 and the first contact plug 372 may be turned off, and thus first and second portions of the active fin 105 in the first and second cell regions CR1 and CR2, respectively, under the first gate structure 282 may be electrically connected with each other.

The impurity layer 210 that may be formed in the PMOS region of the first region I and supplied with a plus voltage from the power rail 462 through the third via 426 and the third contact plug 342 may serve as a source region of a transistor including the second gate structure 284. The impurity layer 210 that may be formed in the PMOS region of the first region I and supplied with a voltage from the wiring 464 through the fourth via 428 and the fourth contact plug 344 may serve as a drain region of the transistor including the second gate structure 284.

Likewise, the first gate structure 282 that may be formed in the NMOS region of the first region I and supplied with a ground voltage or a minus voltage from the power rail 462 through the first via 422 and the first contact plug 372 may be turned off, and thus first and second portions of the active fin 105 in the first and second cell regions CR1 and CR2, respectively, under the first gate structure 282 may be electrically insulated from each other.

The impurity layer 210 that may be formed in the NMOS region of the first region I and supplied with a ground voltage or a minus voltage from the power rail 462 through the third via 426 and the third contact plug 342 may serve as a source region of a transistor including the second gate structure 284. The impurity layer 210 that may be formed in the NMOS region of the first region I and supplied with a voltage from the wiring 464 through the fourth via 428 and the fourth contact plug 344 may serve as a drain region of the transistor including the second gate structure 284.

In some embodiments, the first gate structure 282 may be formed at a boundary area between cell regions of the first region I, for example, at a boundary area between the first and second cell regions CR1 and CR2 to extend to the second region II, and may be supplied with a turn-off signal from the power rail 462 through the first via 422 and the first contact plug 372 in the second region II. Thus, no channel may be formed in a portion of the active fin 105 continuously extending in the first direction under the first gate structure 282. In other words, first and second portions of the active fin 105 at both sides of the boundary area between the first and second cell regions CR1 and CR2 may be electrically insulated from each other.

The first via 422 and the first contact plug 372 on the first gate structure 282 may not be formed in the first region I but be formed in the second region II, and thus may not occupy spaces for cell structures in the first region I, for example, the second and fourth contact plugs 374 and 344 or the second and fourth vias 424 and 428. In other words, the first gate structure 282 for electrically insulating neighboring cells in the first direction, and the first via 422 and the first contact plug 372 for applying electrical signal to the first gate structure 282 may be formed not in the first region I but in the second region II, and thus the freedom degree for implementing the layout of the cells in the first region I may not be violated.

FIGS. 7 to 37 are plan views or cross-sections illustrating processing steps in the fabrication of a semiconductor device in accordance with some embodiments of the present inventive concept. Particularly, FIGS. 7, 9, 11, 15, 19, 22, 25, 28 and 33 are plan views, and FIGS. 8, 10, 12-14, 16-18, 20-21, 23-24, 26-27, 29-32 and 34-37 are cross-sections. FIGS. 7 to 37 are figures of a region X of FIG. 1A.

FIGS. 8, 10, 12, 26, 29 and 34 are cross-sections taken along lines A-A' of corresponding plan views, FIGS. 13, 16, 30 and 35 are cross-sections taken along lines B-B' of corresponding plan views, FIGS. 14, 17, 20, 23, 27, 31 and 36 are cross-sections taken along lines C-C' of corresponding plan views, and FIGS. 18, 21, 24, 32 and 37 are cross-sections taken along lines D-D' of corresponding plan views.

Figure 7:
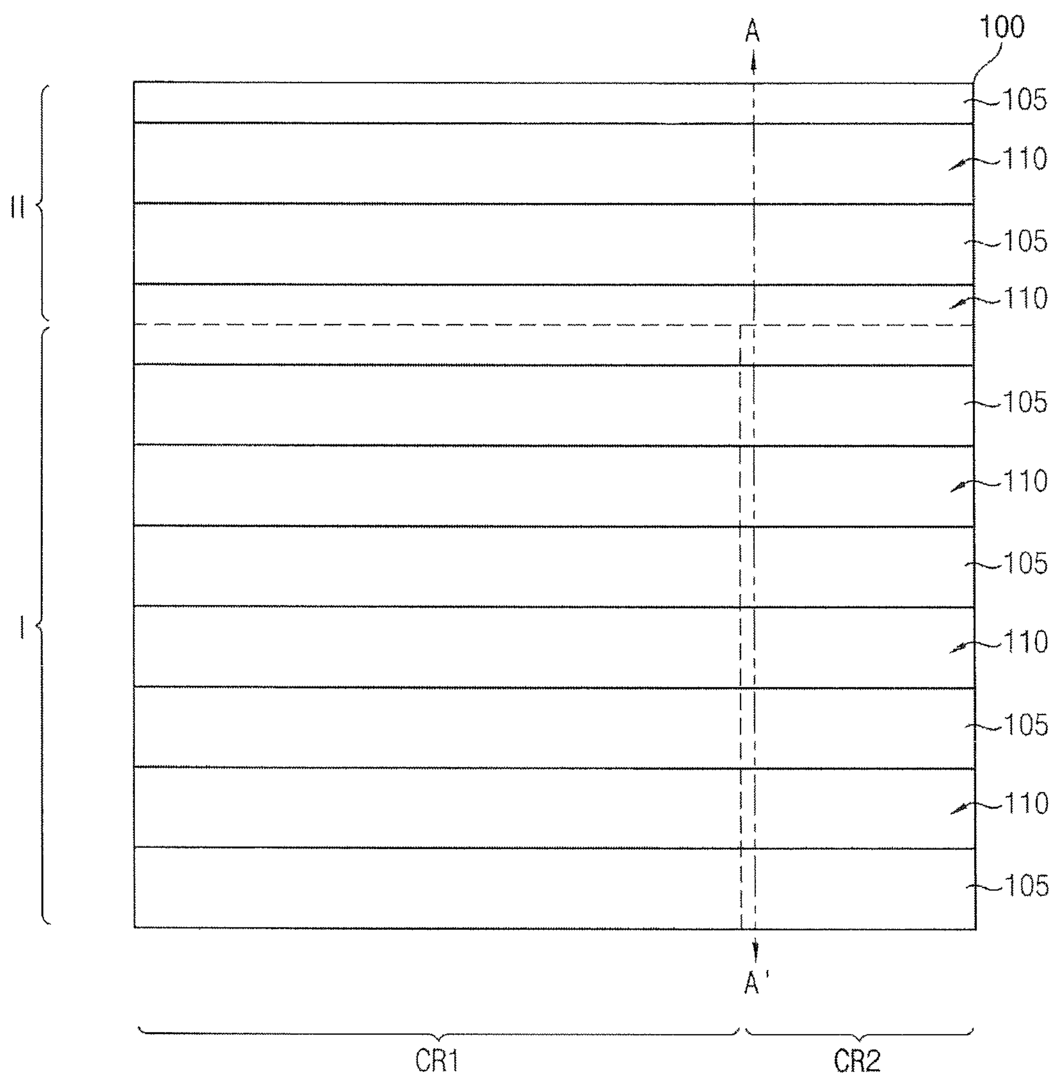
FIGS. 7 to 37 are plan views and cross-sections illustrating processing steps in the fabrication of semiconductor devices in accordance with some embodiments of the present inventive concept.
Figure 8:
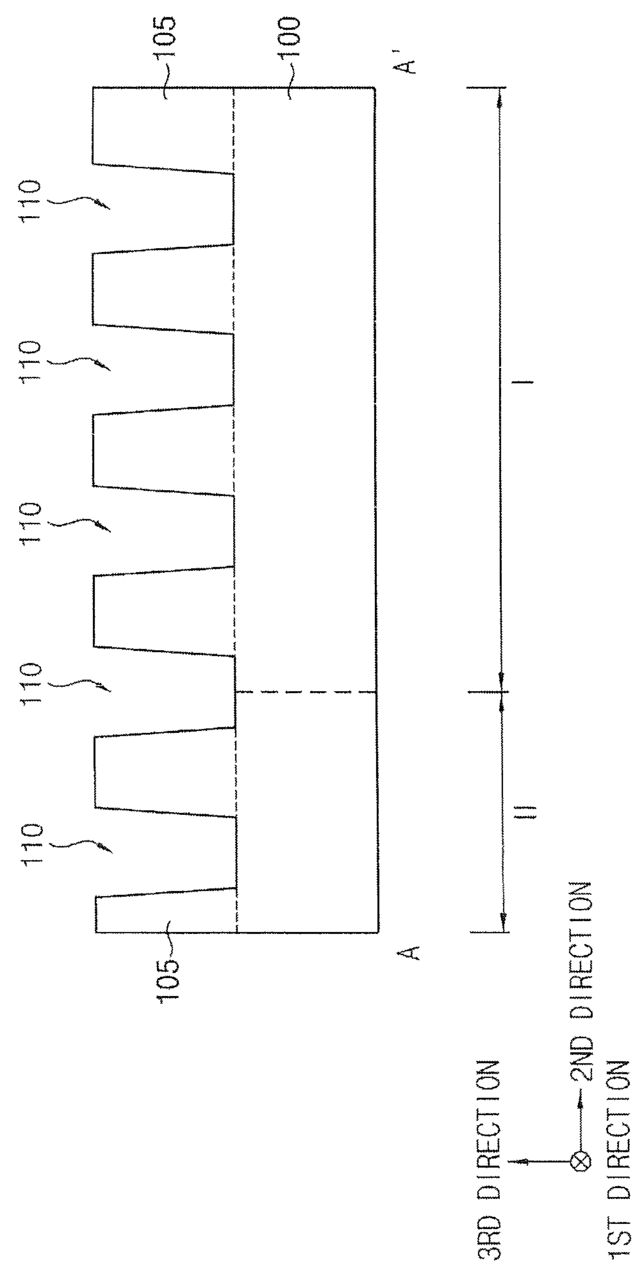

Referring first to FIGS. 7 and 8, an upper portion of a substrate 100 may be partially removed to form a first recess 110, and thus an active fin 105 may be formed to protrude from the substrate 100.

In some embodiments, the active fins 105 may extend in the first direction in the first and second regions I and II, and a plurality of active fins 105 may be formed to be spaced apart from each other in the second direction.

Figure 9:
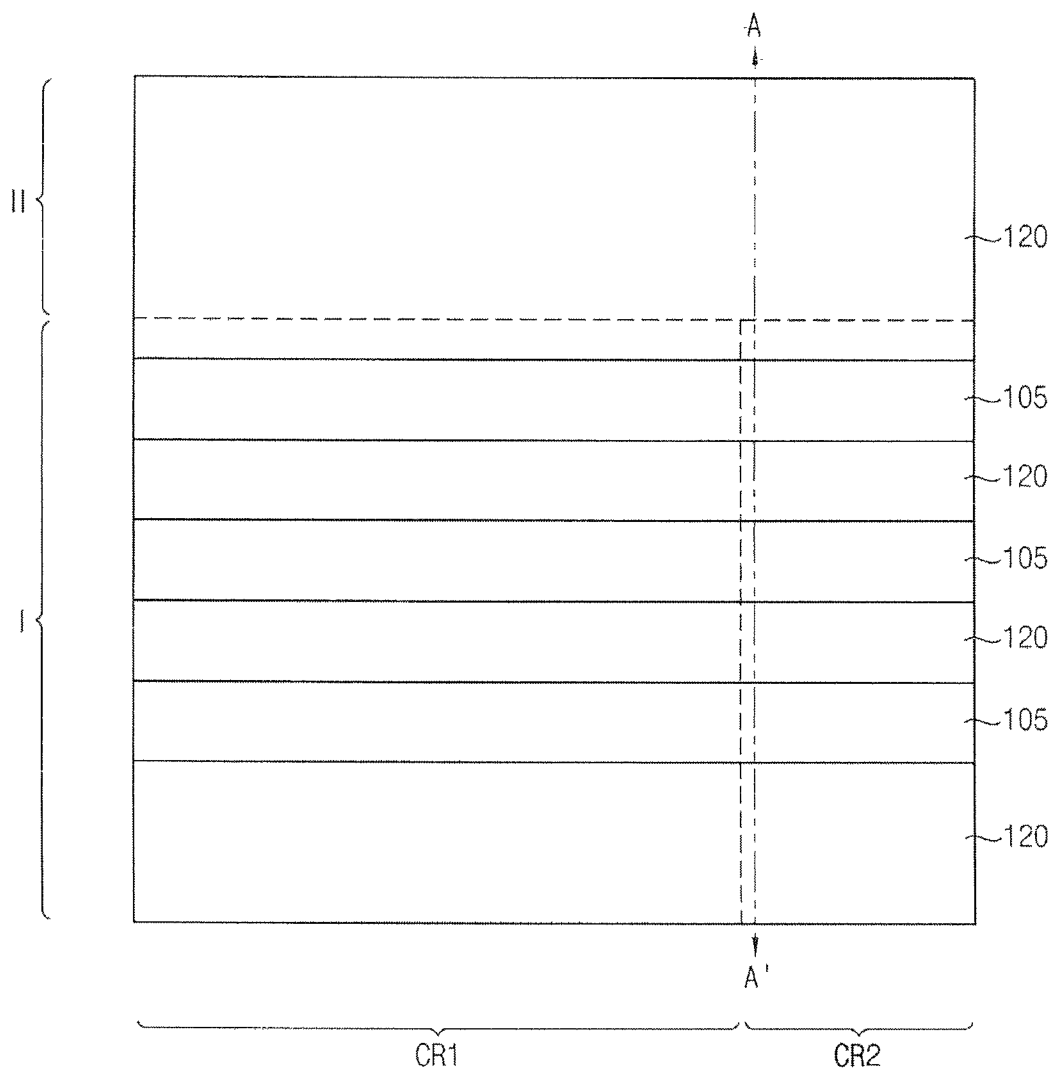
Figure 10:
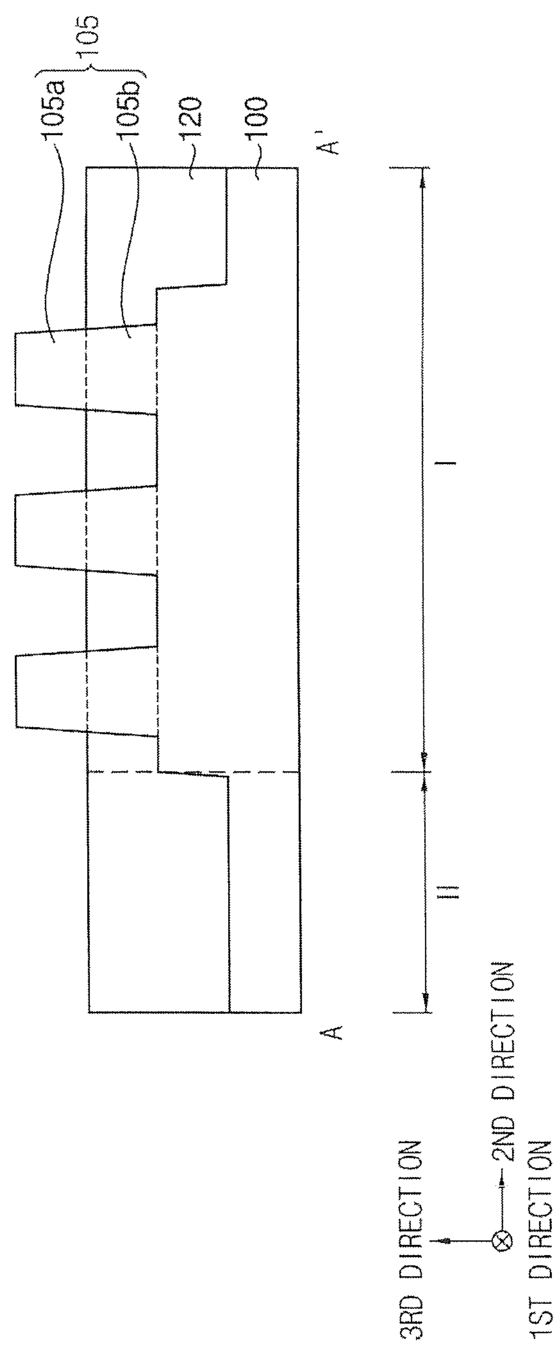
Figure 11:
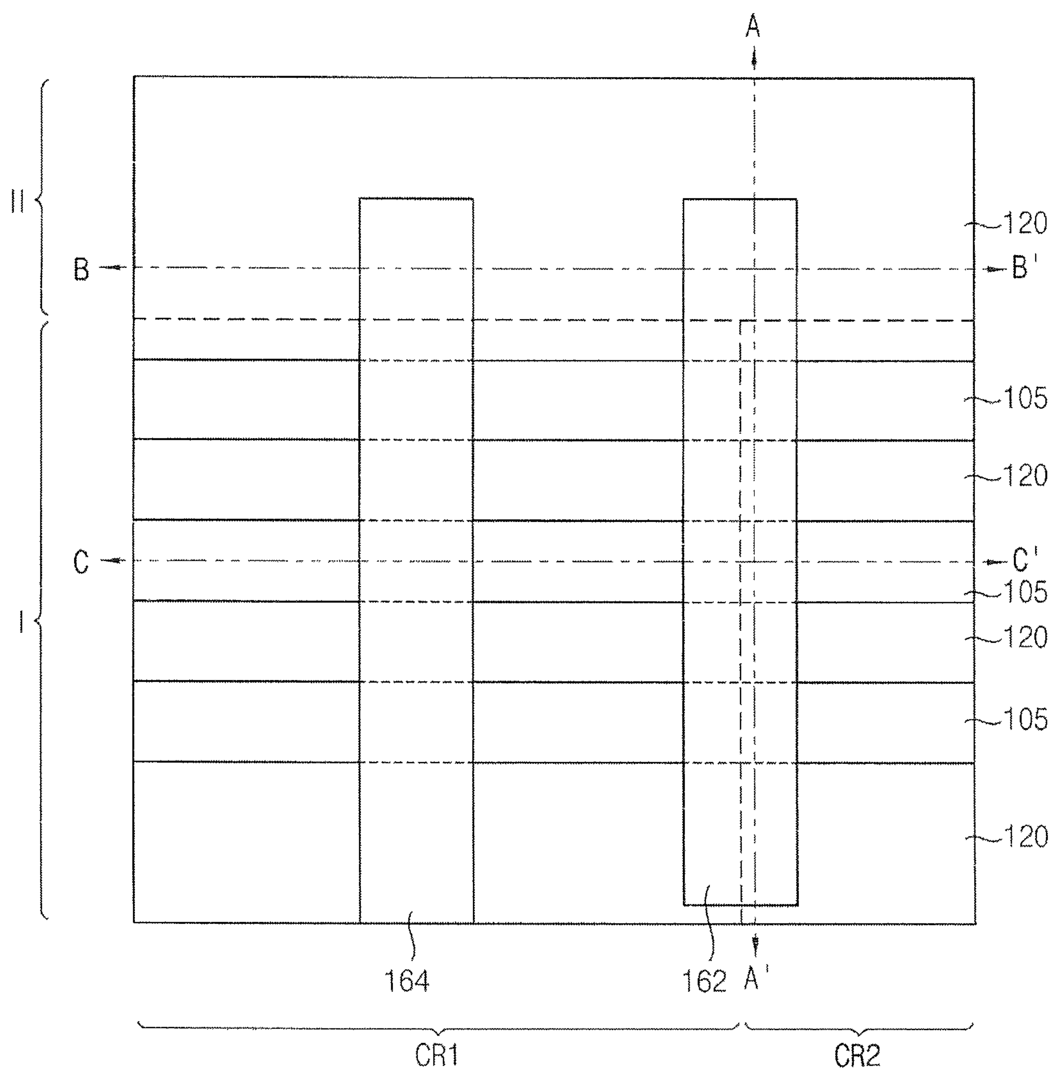
Figure 11:
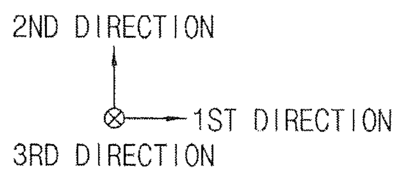
Figure 12:
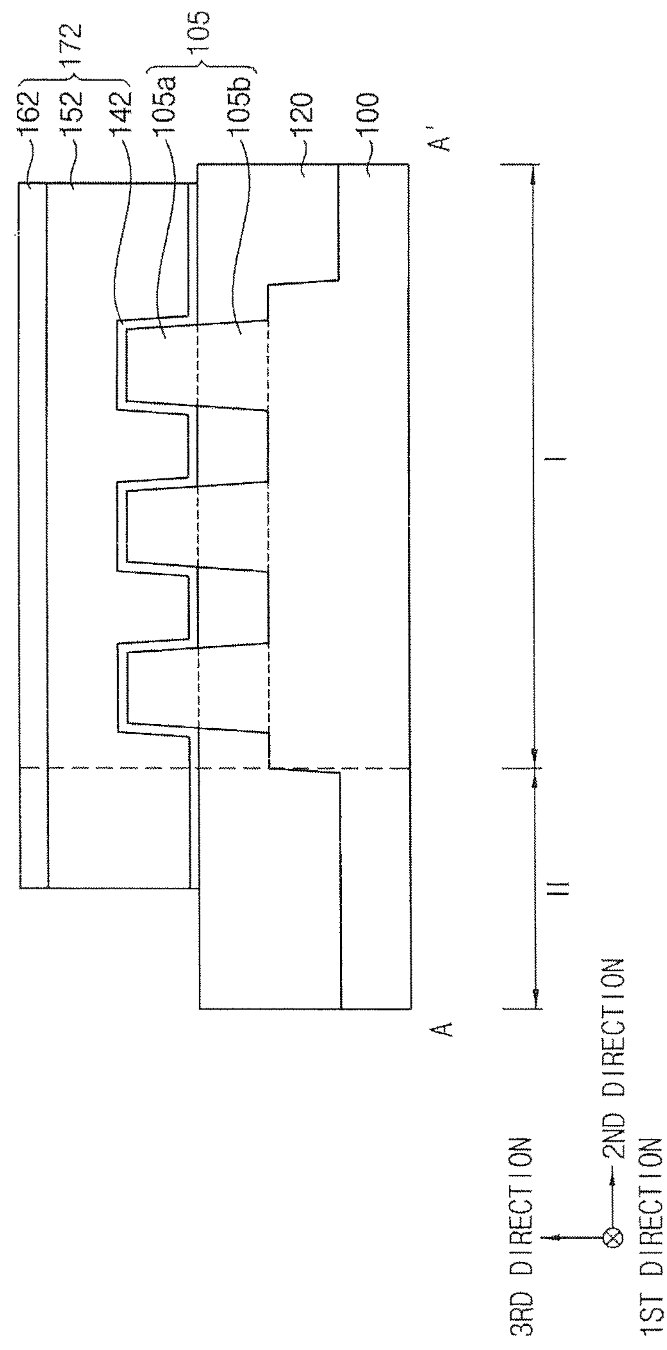
Figure 13:
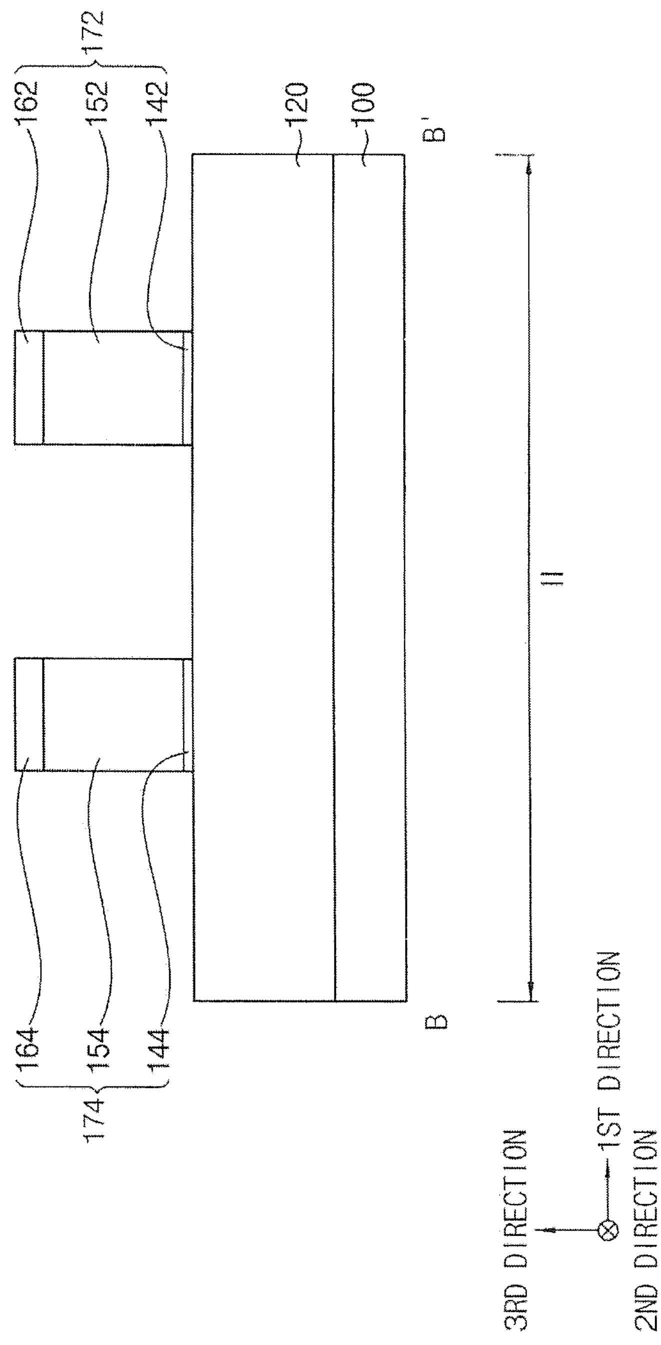
Figure 14:
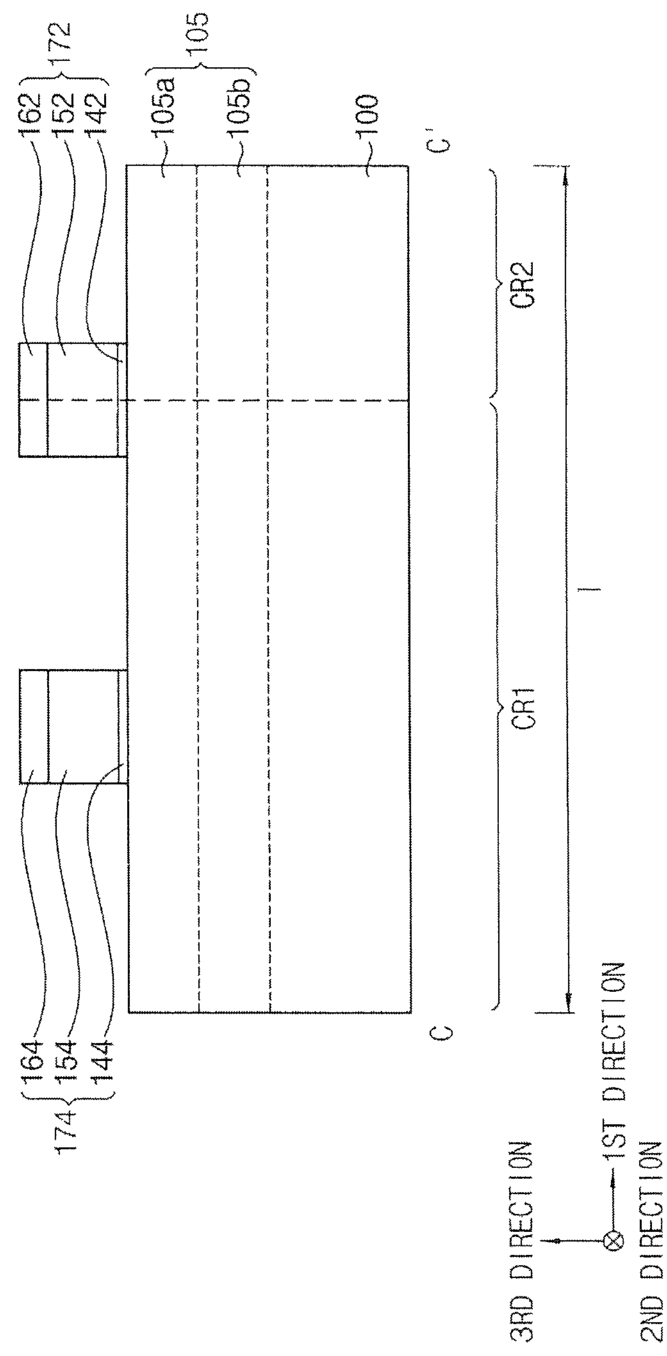
Figure 15:
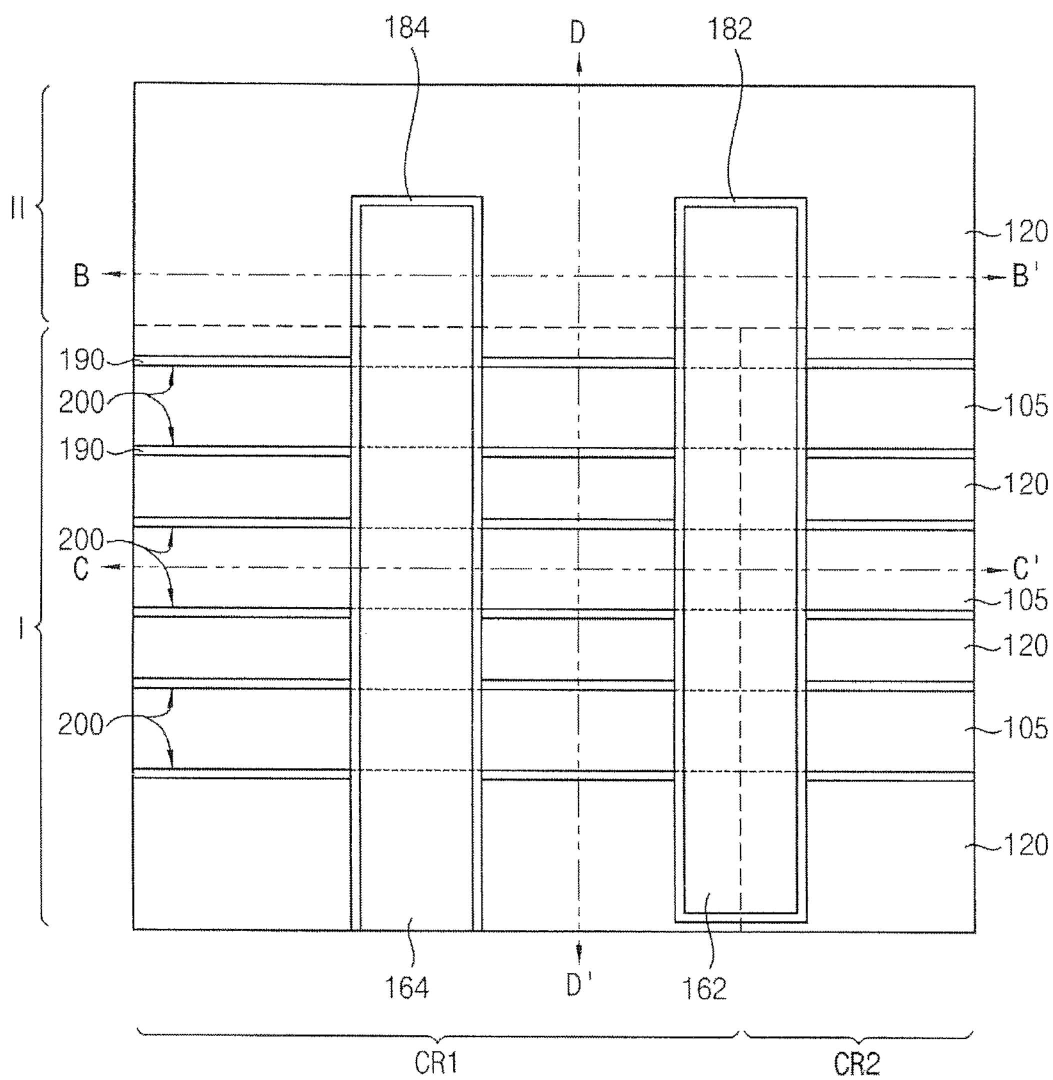
Figure 16:
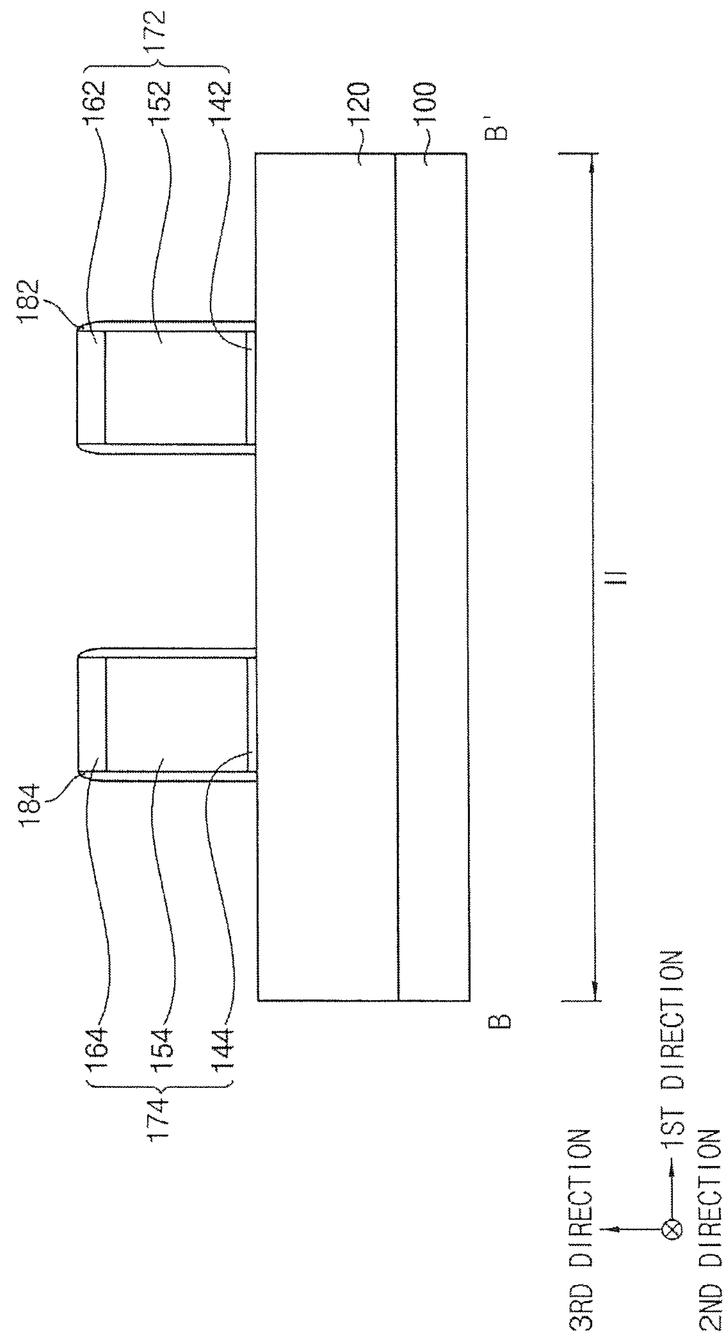
Figure 17:
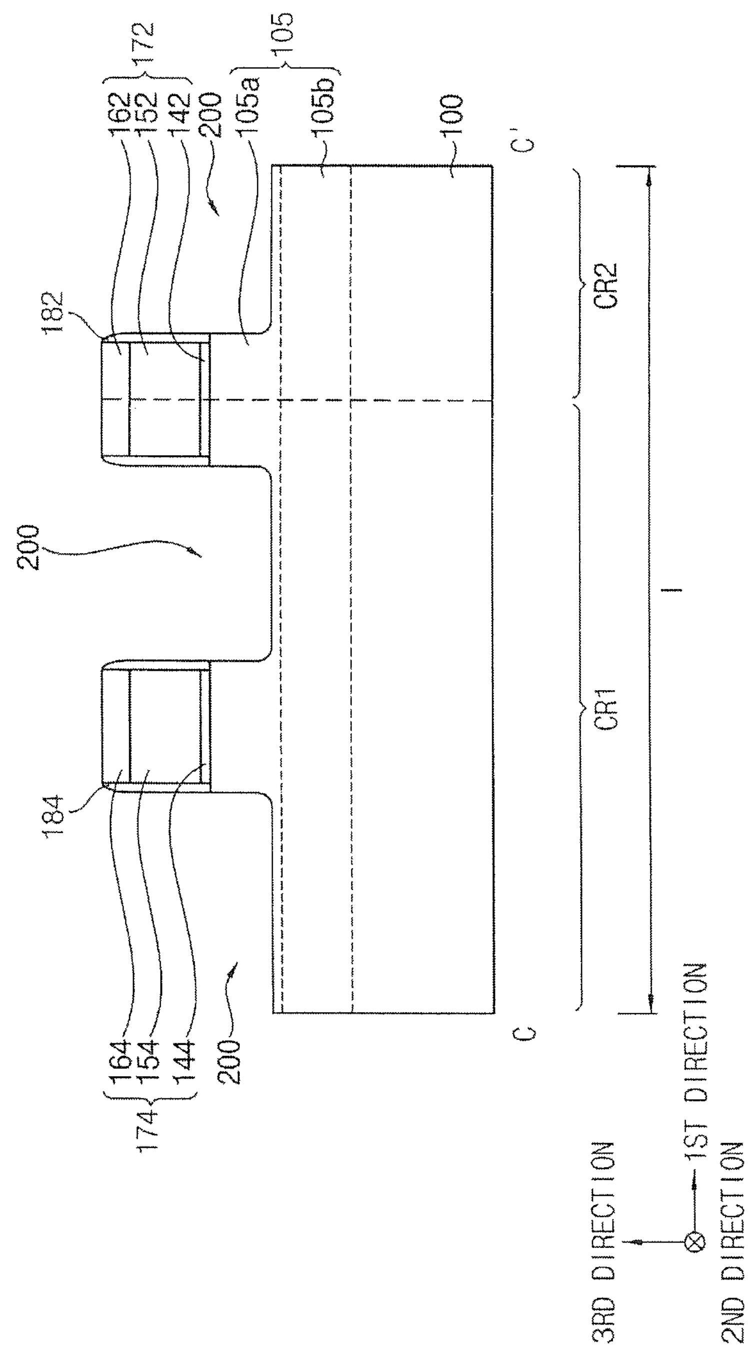
Figure 18:
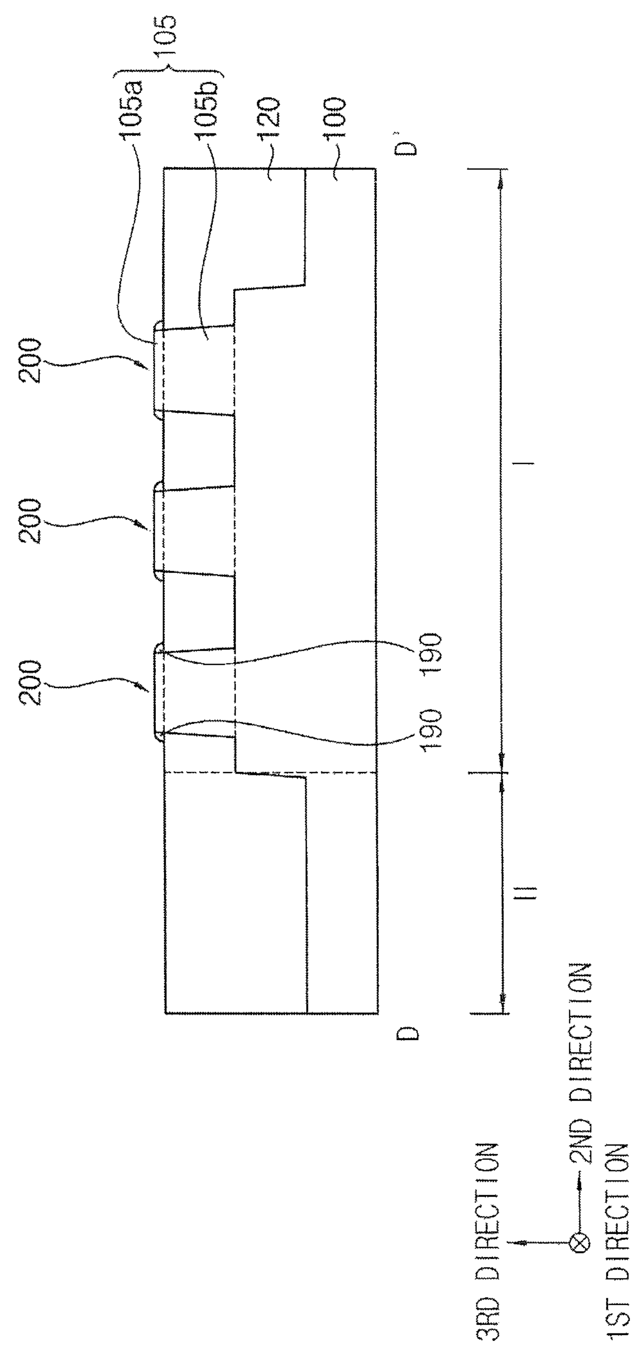

Referring to FIGS. 9 and 10, the active fins 105 and an upper portion of the substrate 100 may be etched using a first etching mask (not shown) covering a portion of the first region I to form a second recess (not shown), and an isolation pattern 120 may be formed to fill the second recess and a lower portion of the first recess 110.

In some embodiments, the first etching mask may cover ones of the active fins 105 in a portion of the first region I adjacent the second region II, and thus ones of the active fins 105 far from the second region II, i.e., ones of the active fins 105 at a central portion of the first region I in the second direction and ones of the active fins 105 in the second region II may be removed.

Referring to FIG. 1B, the first region I may include a PMOS region and an NMOS region, which may be spaced apart from each other in the second direction. In other words, each of the PMOS and NMOS regions may include an active region having one or a plurality of active fins 105, and the PMOS and NMOS regions may be divided from each other by a portion of the isolation pattern 120 at a central portion of the first region I in the second direction.

The isolation pattern 120 may be formed by removing the first etching mask, forming an isolation layer on the substrate 100 to fill the second recess and the first recess 110, and removing a portion of the isolation layer until upper portions of the active fins 105 may be exposed. The isolation pattern 120 may fill the second recess and cover a lower sidewall of the active fin 105.

Referring to FIGS. 11 to 14, first and second dummy gate structures 172 and 174 may be formed on the substrate 100. The first and second dummy gate structures 172 and 174 may be forming by sequentially forming a dummy gate insulation layer, a dummy gate electrode layer, and a dummy gate mask layer on the active fins 105 of the substrate 100 and the isolation pattern 120, etching the dummy gate mask layer using a second etching mask (not shown) to form first and second dummy gate masks 162 and 164, and sequentially etching the dummy gate electrode layer and the dummy gate insulation layer using the first and second dummy gate masks 162 and 164 as an etching mask. Thus, each of the first and second dummy gate structures 172 and 174 may extend in the second direction on the active fins 105 and the isolation pattern 120.

The first dummy gate structure 172 may include a first dummy gate insulation pattern 142, a first dummy gate electrode 152 and the first dummy gate mask 162 sequentially stacked on the active fins 105 of the substrate 100 and a portion of the isolation pattern 120 adjacent to the active fins 105 in the second direction, and the second dummy gate structure 174 may include a second dummy gate insulation pattern 144, a second dummy gate electrode 154 and the second dummy gate mask 164 sequentially stacked on the active fins 105 of the substrate 100 and a portion of the isolation pattern 120 adjacent to the active fins 105 in the second direction.

The dummy gate insulation layer may include an oxide, for example, silicon oxide, the dummy gate electrode layer may include, for example, polysilicon, and the dummy gate mask layer may include a nitride, for example, silicon nitride. The dummy gate insulation layer may be formed by a chemical vapor deposition (CVD) process, an atomic layer deposition (ALD) process, or the like. Alternatively, the dummy gate insulation layer may be formed by a thermal oxidation process on an upper portion of the substrate 100, and in this case, the dummy gate insulation layer may not be formed on the isolation pattern 120 but formed only on the active fins 105. The dummy gate electrode layer and the dummy gate mask layer may be also formed by a CVD process, an ALD process, and the like The first and second dummy gate structures 172 and 174 may be partially removed by an etching process using a third etching mask (not shown).

In some embodiments, a central portion of the first dummy gate structure 172 in the second direction in each of the first and second regions I and II may be removed by the etching process. Thus, the first dummy gate structure 172 may extend from a boundary area between neighboring cell regions, for example, from a boundary area between the first and second cell regions CR1 and CR2 to one second region II. In some embodiments, two first dummy gate structures 172 each extending in the second direction to one second region II, which may be spaced apart from each other in the second direction, may be formed at the boundary area between cell regions.

A plurality of second dummy gate structures 174 may be spaced apart from each other in the first direction. Central portions of ones of the second dummy gate structures 174 in the second direction in the second region II may be removed by the etching process, and central portions of other ones of the second dummy gate structures 174 in the second direction in each of the first and second regions I and II may be removed by the etching process. Thus, ones of the second dummy gate structures 174 may extend over the first region I and two second regions II adjacent thereto, and other ones of the second dummy gate structures 174 may extend over a portion of the first region I and one second region H adjacent thereto.

Referring to FIGS. 15 to 18, first and second gate spacers 182 and 184 may be formed on sidewalls of the first and second dummy gate structures 172 and 174, respectively, and a fin spacer 190 may be formed on a sidewall of each of the active fins 105.

In some embodiments, the first and second gate spacers 182 and 184 and the fin spacer 190 may be formed by forming a spacer layer on the first and second dummy gate structures 172 and 174, the active fins 105, and the isolation pattern 120, and anisotropically etching the spacer layer.

Upper portions of the active fins 105 adjacent the first and second dummy gate structures 172 and 174 may be etched to form a third recess 200.

Particularly, the upper portions of the active fins 105 may be etched using the first and second dummy gate structures 172 and 174 and the first and second gate spacers 182 and 184 on the sidewalls thereon as an etching mask to form the third recess 200. The fin spacer 190 may be also etched in the etching process. In the figures, the upper active pattern 105*a* in each of the active fins 105 is partially etched to form the third recess 200; however, the inventive concept may not be limited thereto. For example, the third recess 200 may be formed by removing not only the upper active pattern 105*a* but also a portion of the lower active pattern 105*b*.

Figure 19:
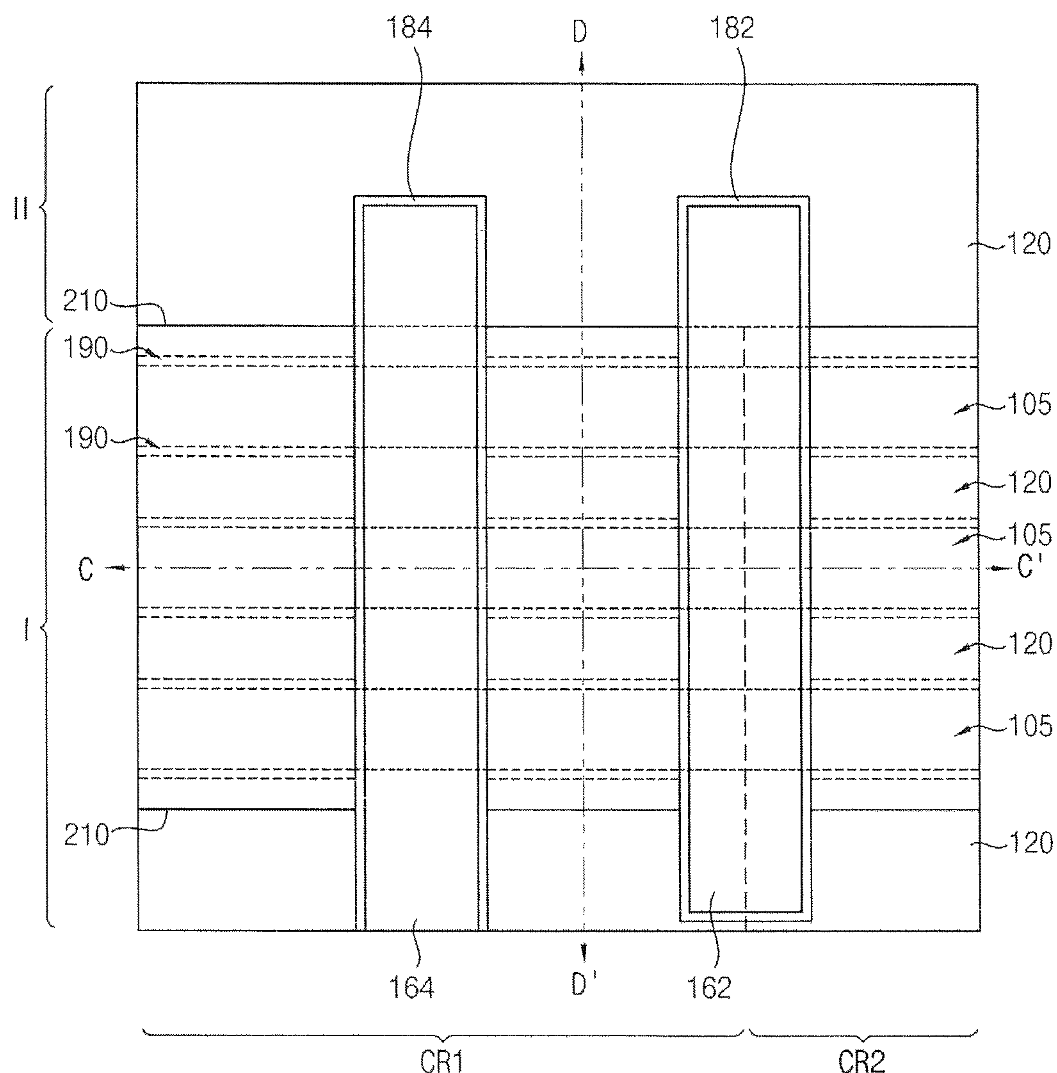
Figure 20:
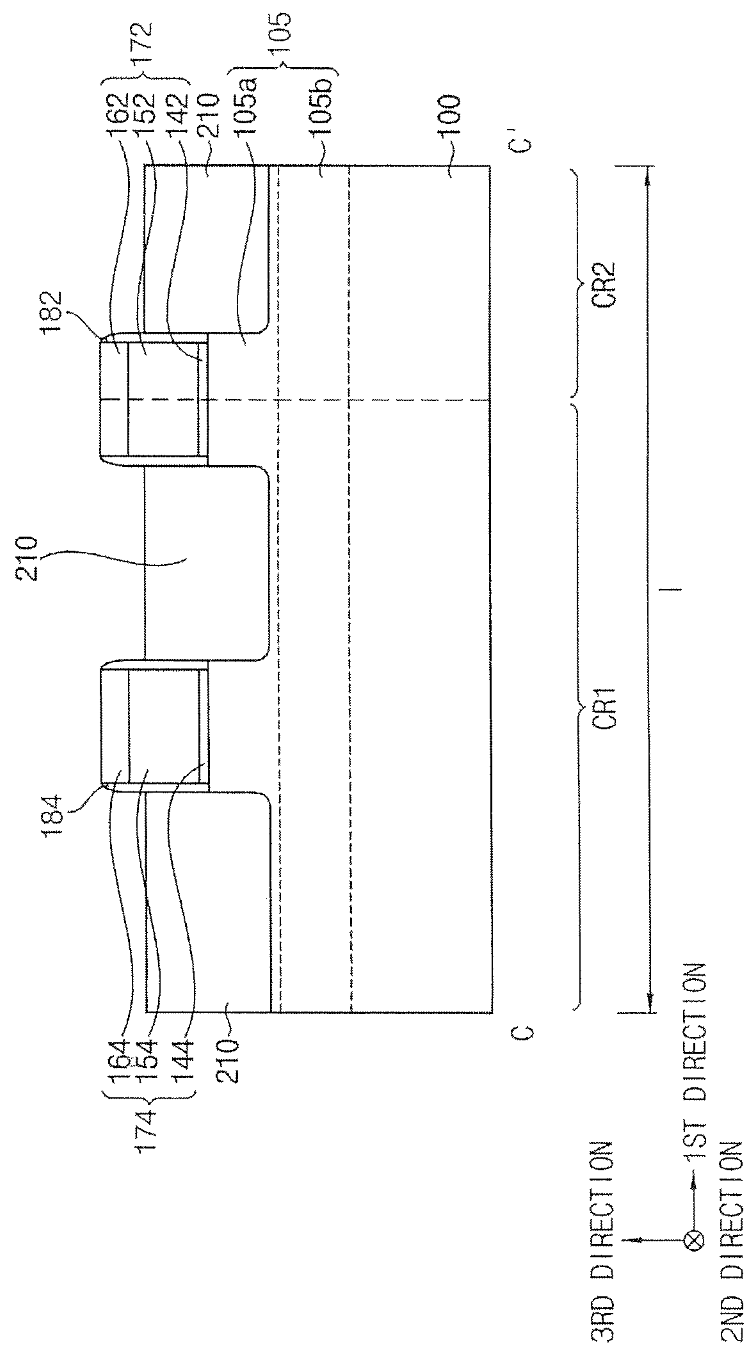
Figure 21:
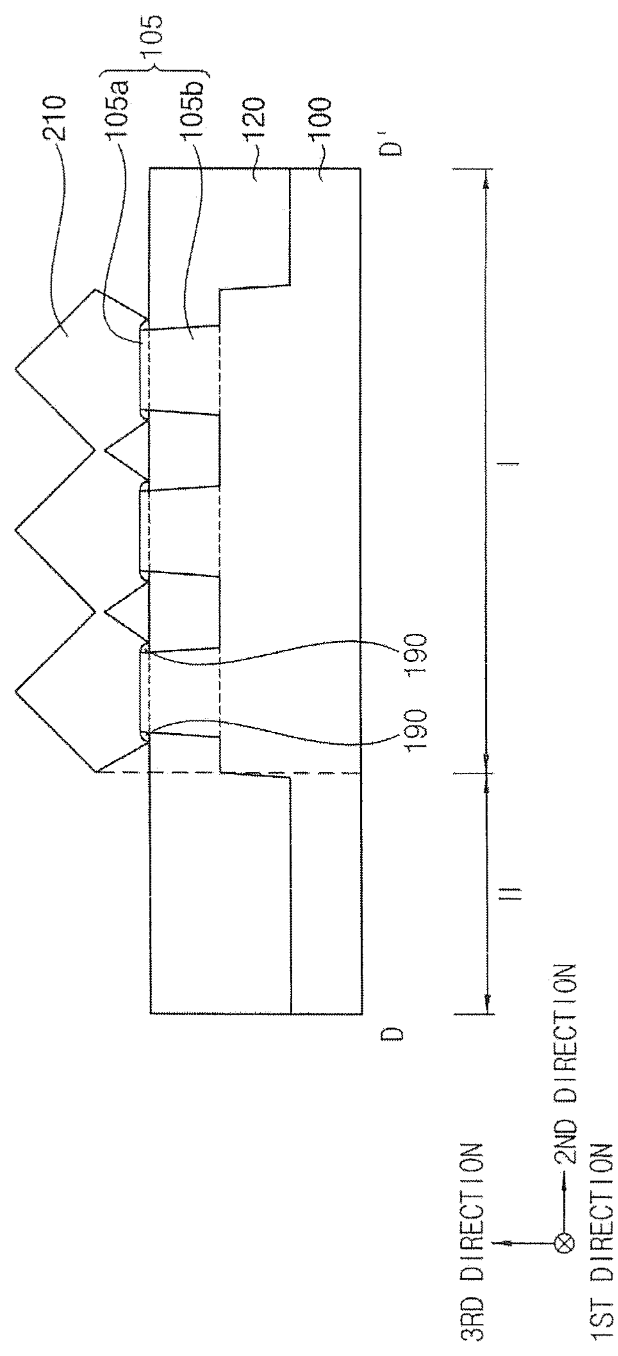

Referring to FIGS. 19 to 21, an impurity layer 210 may be formed on each of the active fins 105 to fill the third recess 200. In some embodiments, the impurity layer 210 may be formed by a selective epitaxial growth (SEG) process using a top surface of each of the active fins 105 exposed by the third recess 200 as a seed.

In some embodiments, the SEG process may be performed using a silicon source gas, for example, dichlorosilane ($SiH_2Cl_2$) gas, and a germanium source gas, for example, germane ($GeH_4$) gas to form a single crystalline silicon-germanium layer. A p-type impurity source gas, for example, diborane ($B_2H_6$) gas may be also used to form a single crystalline silicon-germanium layer doped with p-type impurities. Accordingly, the impurity layer 210 may serve as a source/drain region of a PMOS transistor.

Alternatively, the SEG process may be performed using a silicon source gas, for example, disilane ($Si_2H_6$) gas and a carbon source gas, for example, monomethylsilane ($SiH_3CH_3$) gas to form a single crystalline silicon carbide layer. Alternatively, the SEG process may be performed using only a silicon source gas, for example, disilane ($Si_2H_6$) gas to form a single crystalline silicon layer. An n-type impurity source gas, for example, phosphine ($PH_3$) gas may be also used to form a single crystalline silicon carbide layer doped with n-type impurities or a single crystalline silicon layer doped with n-type impurities. Accordingly, the impurity layer 210 may serve as a source/drain region of an NMOS transistor.

The impurity layer 210 may grow both in vertical and horizontal directions, and may not only fill the third recess 200 but also contact portions of the first and second gate spacers 182 and 184. An upper portion of the impurity layer 200 may have a cross-section taken along the second direction of which a shape may be pentagon or hexagon. When the active fins 105 are spaced apart from each other in the second direction by a short distance, neighboring ones of the impurity layers 210 in the second direction may be merged with each other to form a single layer. In the figures, one merged impurity layer 210 grown from the neighboring three active fins 105 in the second direction is shown.

Figure 22:
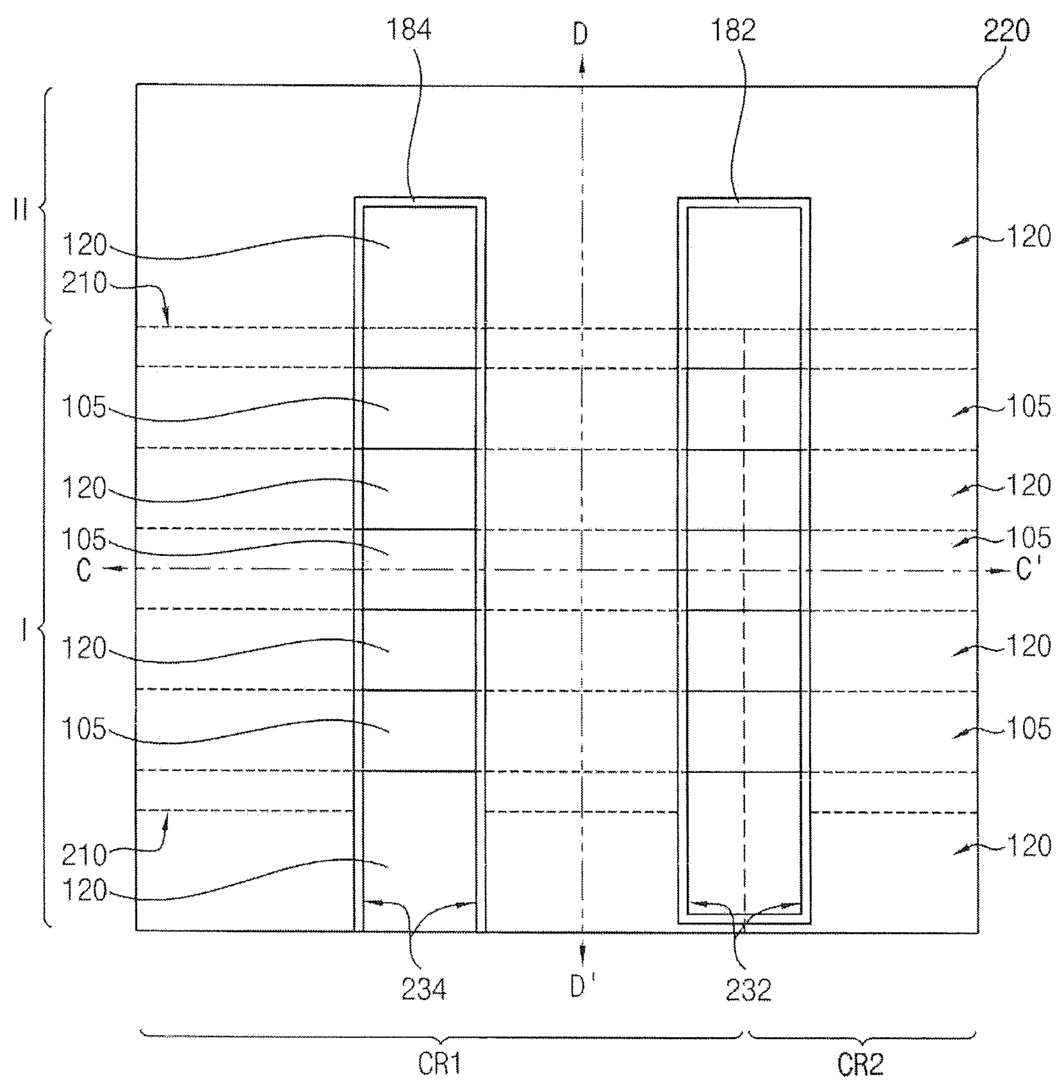
Figure 23:
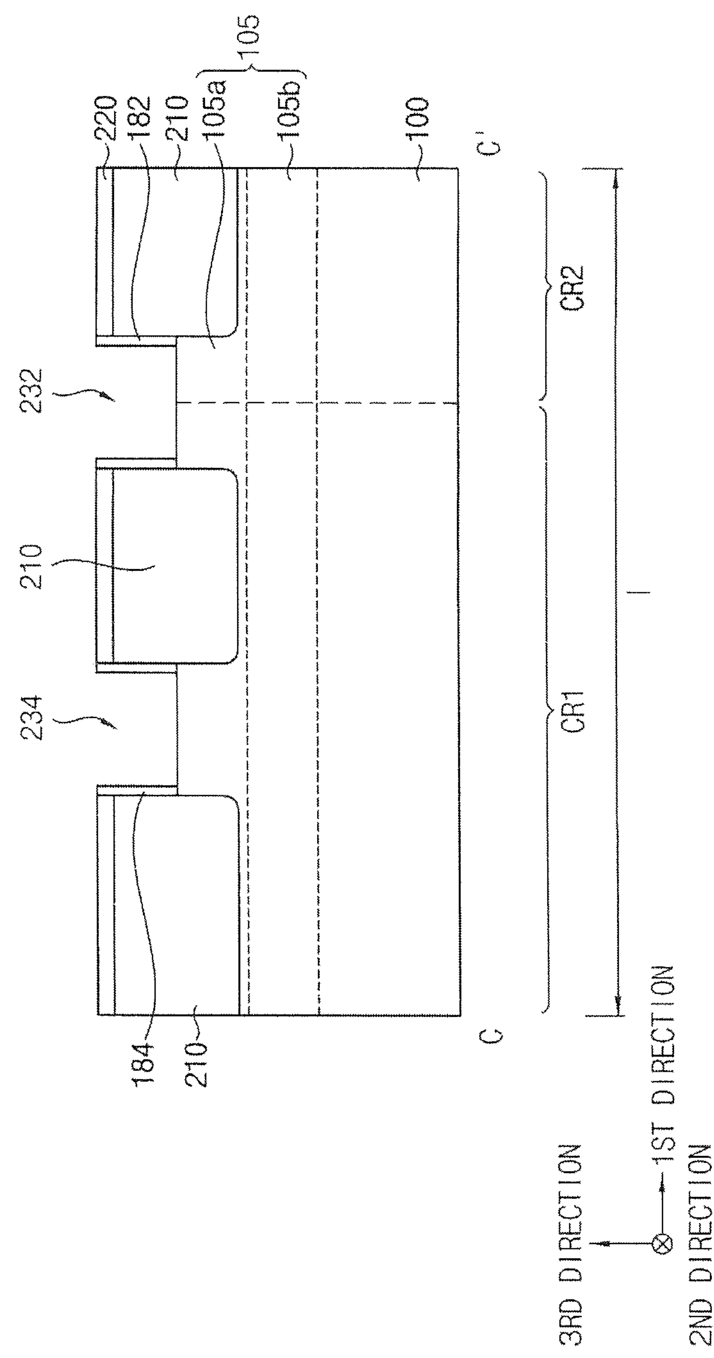
Figure 24:
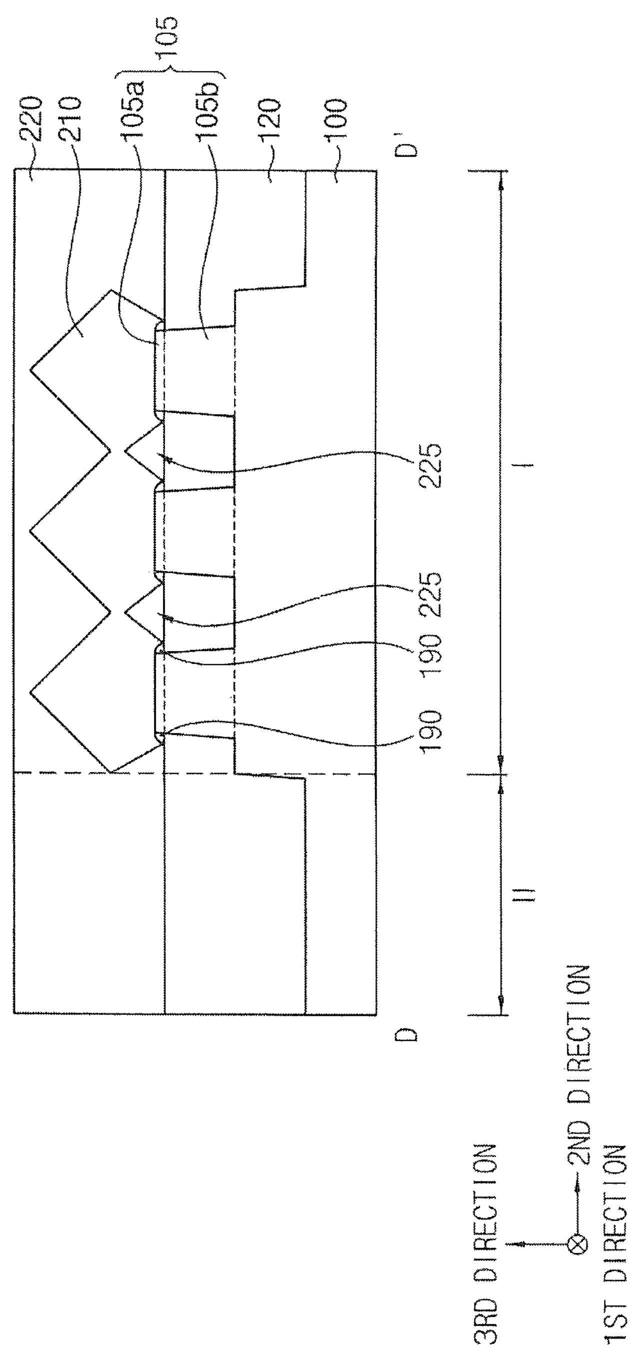

Referring to FIGS. 22 to 24, a first insulating interlayer 220 may be formed on the active fins 105 and the isolation pattern 120 to cover the first and second dummy gate structures 172 and 174, the first and second gate spacers 182 and 184, the fin spacer 190, and the impurity layers 210, and the first insulating interlayer 220 may be planarized until a top surface of the first and second dummy gate electrodes 152 and 154 of the first and second dummy gate structures 172 and 174, respectively, may be exposed. The first and second dummy gate masks 162 and 164 may be also removed, and upper portions of the first and second gate spacers 182 and 184 may be also removed. A space between the merged impurity layer 210 and the isolation pattern 120 may not be fully filled with the first insulating interlayer 220, and thus an air gap 225 may be formed.

The planarization process may be performed by a chemical mechanical polishing (CMP) process and/or an etch back process.

The exposed first and second dummy gate electrodes 152 and 154, and the first and second dummy gate insulation patterns 142 and 144 thereunder may be removed to form a first opening 232 exposing a top surface of the active fin 105, a top surface of the isolation pattern 120 and an inner sidewall of the first gate spacer 182, and a second opening 234 exposing a top surface of the active fin 105, a top surface of the isolation pattern 120 and an inner sidewall of the second gate spacer 184.

Figure 25:
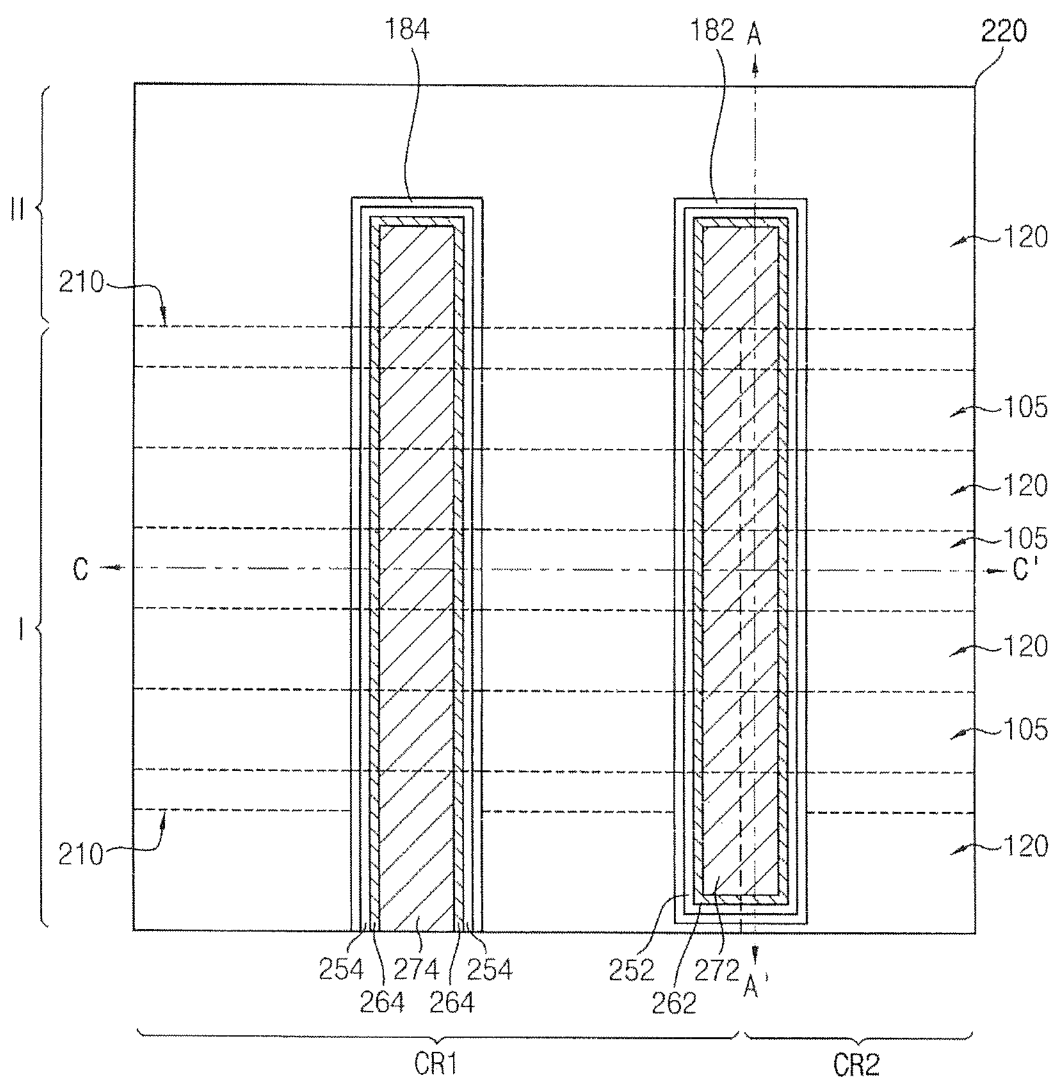
Figure 26:
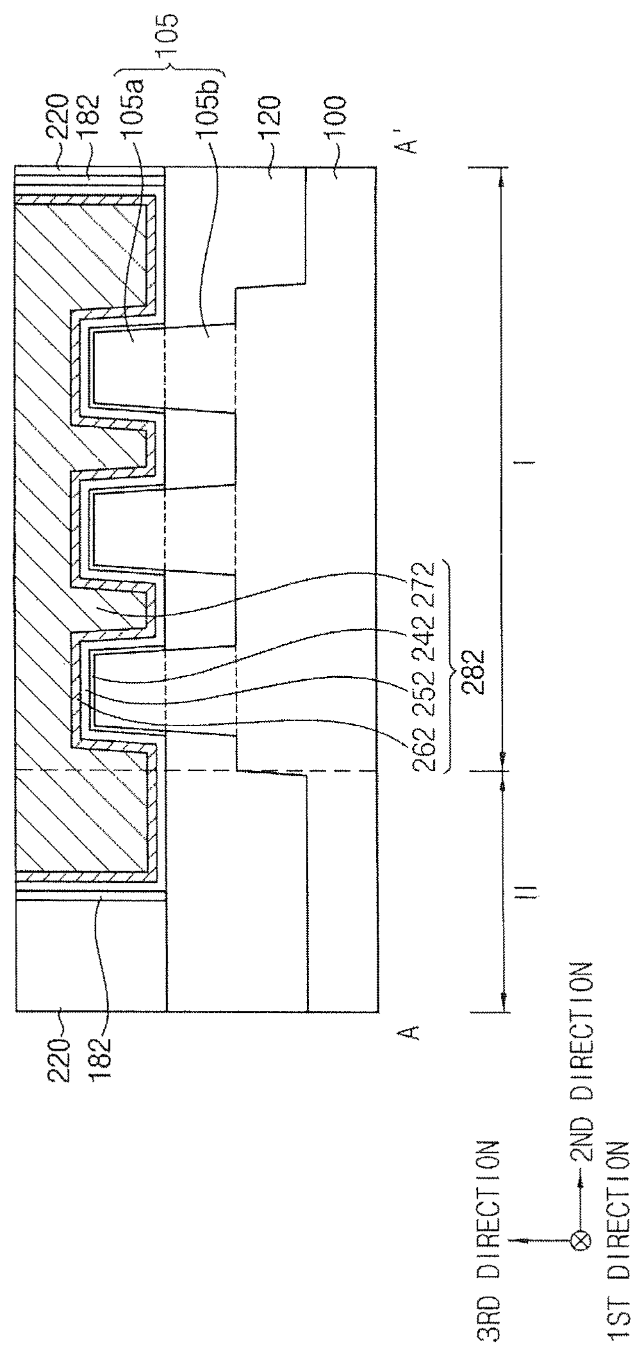
Figure 27:
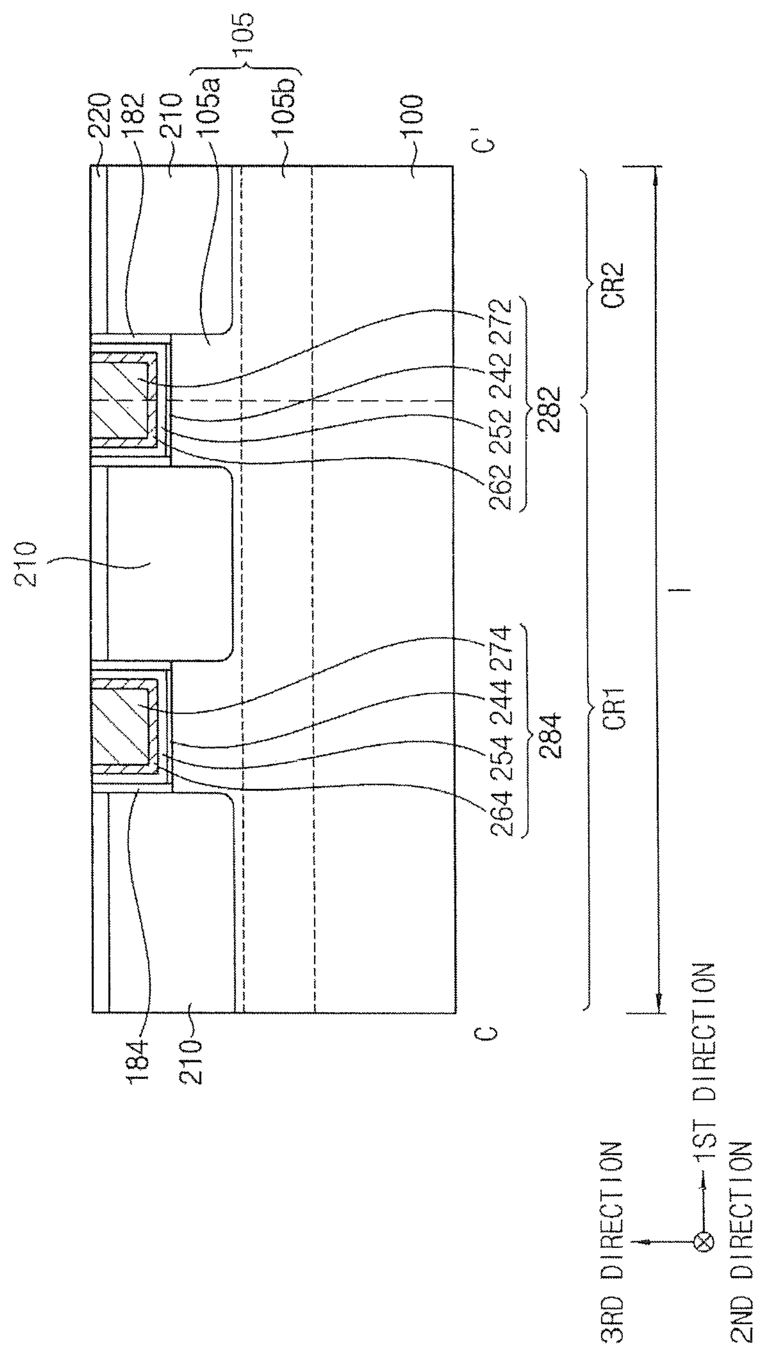
Figure 28:
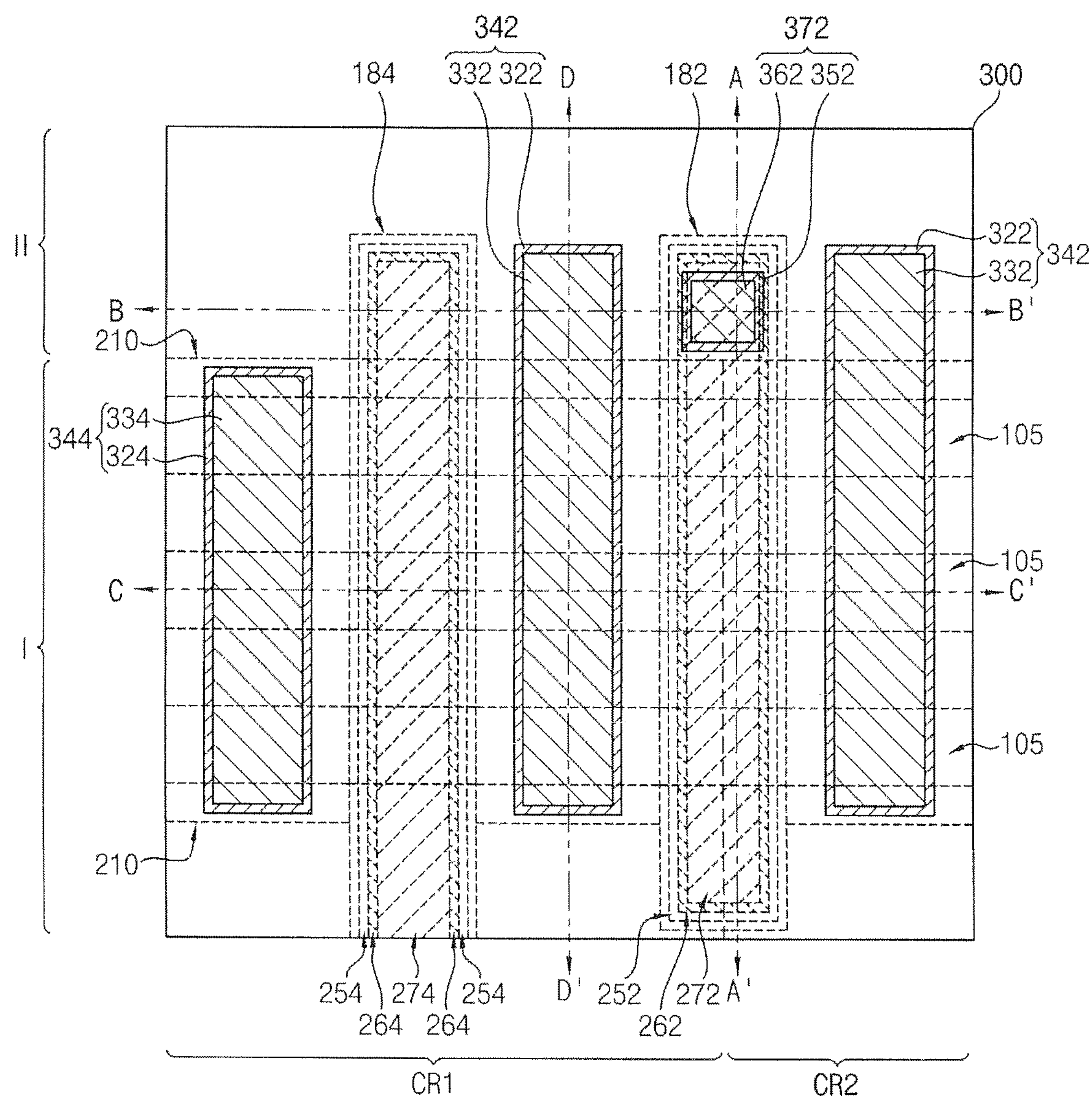

Referring to FIGS. 25 to 27, first and second gate structures 282 and 284 may be formed to fill the first and second openings 232 and 234, respectively. Particularly, after a thermal oxidation process may be performed on the top surfaces of the active fins 105 exposed by the first and second openings 232 and 234 to form first and second interface patterns 242 and 244, respectively, a gate insulation layer and a workfunction control layer may be sequentially formed on the first and second interface patterns 242 and 244, the isolation pattern 120, the first and second gate spacers 182 and 184 and the first insulating interlayer 220, and a gate electrode layer may be formed on the workfunction control layer to sufficiently fill remaining portions of the first and second openings 232 and 234.

The gate insulation layer, the workfunction control layer and the gate electrode layer may be formed by a CVD process or an ALD process. In some embodiments, a heat treatment process, for example, a rapid thermal annealing (RTA) process, a spike rapid thermal annealing (spike RTA) process, a flash rapid thermal annealing (flash RTA) process or a laser annealing process may be further performed on the gate electrode layer.

The first and second interface patterns 242 and 244 may be formed by a CVD process or an ALD process instead of the thermal oxidation process, and in this case, the first and second interface patterns 242 and 244 may be formed not only on the top surfaces of the active fins 105 but also on the top surfaces of the isolation pattern 120 and the inner sidewalls of the first and second gate spacers 182 and 184.

The gate electrode layer, the workfunction control layer and the gate insulation layer may be planarized until the top surface of the first insulating interlayer 220 may be exposed to form a first gate insulation pattern 252 and a first workfunction control pattern 262 sequentially stacked on the top surface of the first interface pattern 242, the top surface of the isolation pattern 120, and the inner sidewall of the first gate spacer 182, and a first gate electrode 272 filling a remaining portion of the first opening 232 on the first workfunction control pattern 262. Thus, a bottom and a sidewall of the first gate electrode 272 may be covered by the first workfunction control pattern 262. Additionally, a second gate insulation pattern 254 and a second workfunction control pattern 264 sequentially stacked on the top surface of the second interface pattern 244, the top surface of the isolation pattern 120, and the inner sidewall of the second gate spacer 184 may be formed, and a second gate electrode 274 filling a remaining portion of the second opening 234 on the second workfunction control pattern 264 may be formed. Thus, a bottom and a sidewall of the second gate electrode 274 may be covered by the second workfunction control pattern 264.

The first interface pattern 242, the first gate insulation pattern 252, the first workfunction control pattern 262 and the first gate electrode 272 sequentially stacked may form a first gate structure 282, and the first gate structure 282 and the impurity layer 210 may form an NMOS transistor or a PMOS transistor. Additionally, the second interface pattern 244, the second gate insulation pattern 254, the second workfunction control pattern 264 and the second gate electrode 274 sequentially stacked may form a second gate structure 284, and the second gate structure 284 and the impurity layer 210 may form an NMOS transistor or a PMOS transistor.

Referring to FIGS. 28, 29A and 30 to 32 together with FIG. 1B, a capping layer 290 and a second insulating interlayer 300 may be sequentially formed on the first insulating interlayer 220, the first and second gate structures 282 and 284, and the first and second gate spacers 182 and 184, and first and second contact plugs 372 and 374 extending through the second insulating interlayer 300 and the capping layer 290 to contact upper surfaces of the first and second gate structures 282 and 284 and third and fourth contact plugs 342 and 344 extending through the first and second insulating interlayers 220 and 300 and the capping layer 290 to contact upper surfaces of the impurity layers 210 may be formed.

The third and fourth contact plugs 342 and 344 may be formed by forming third and fourth openings (not shown) extending through the first and second insulating interlayers 220 and 300 and the capping layer 290 to expose upper surfaces of the impurity layers 210, and filling the third and fourth openings, respectively. In some embodiments; the third opening may expose not only the upper surface of the impurity layer 210 in the first region I but also an upper surface of the isolation pattern 120 in the second region II adjacent thereto in the second direction. The fourth opening may expose only the upper surface of the impurity layer 210 in the first region I.

Before forming the third and fourth contact plugs 342 and 344, first and second metal silicide patterns 312 and 314 may be further formed on the upper surfaces of the impurity layers 210 by forming a metal layer on the upper surfaces of the impurity layers 210 exposed by the third and fourth openings, thermally treating the metal layer, and removing an unreacted portion of the metal layer.

The first and second contact plugs 372 and 374 may be formed by forming fifth and sixth openings (not shown) extending through the second insulating interlayer 300 and the capping layer 290 to expose upper surfaces of the first and second gate structures 282 and 284, respectively, and filling the fifth and sixth openings, respectively. In some embodiments, the fifth opening may expose the upper surface of the first gate structure 282 in the second region II, and the sixth opening may expose the upper surface of the second gate structure 284 in the first region I. As the first contact plug 372 is formed not in the first region I but in the second region II, designing the layout of the cells in the first region I may be more easily.

Figure 29A:
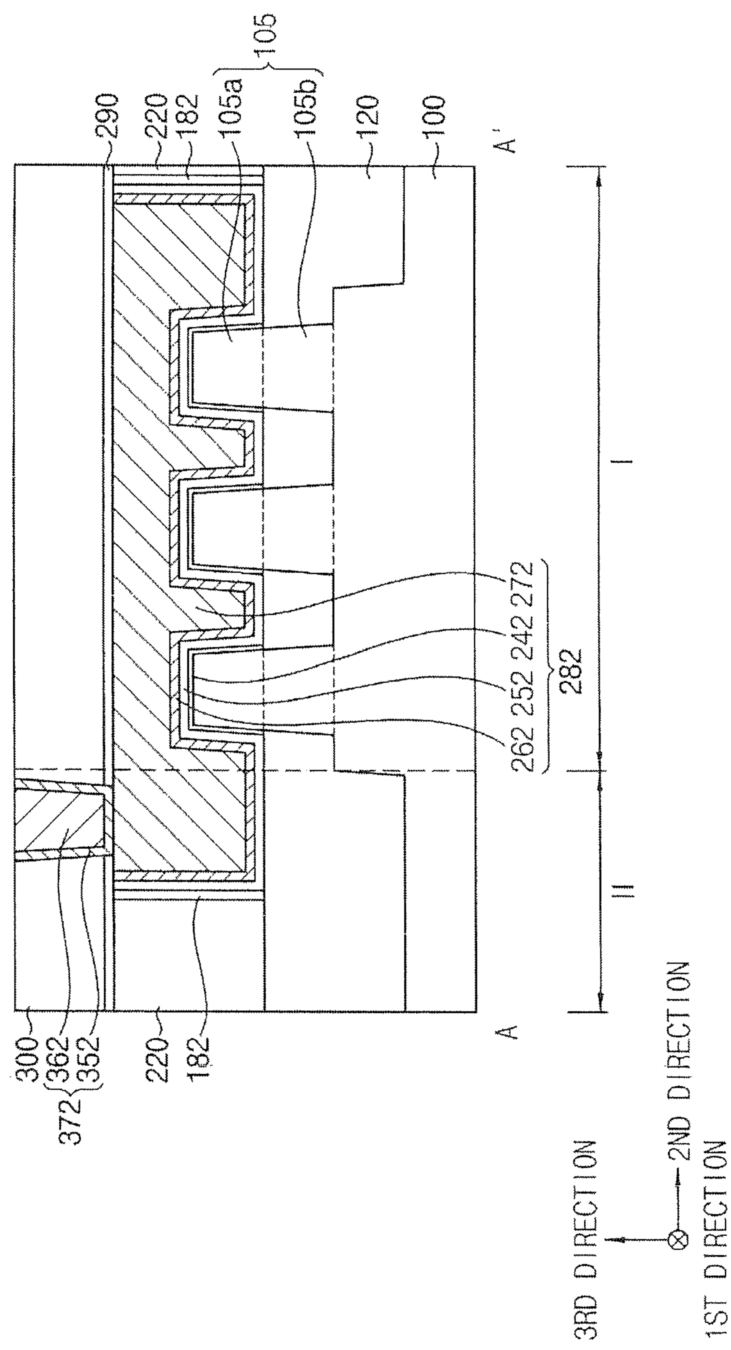
Figure 29B:
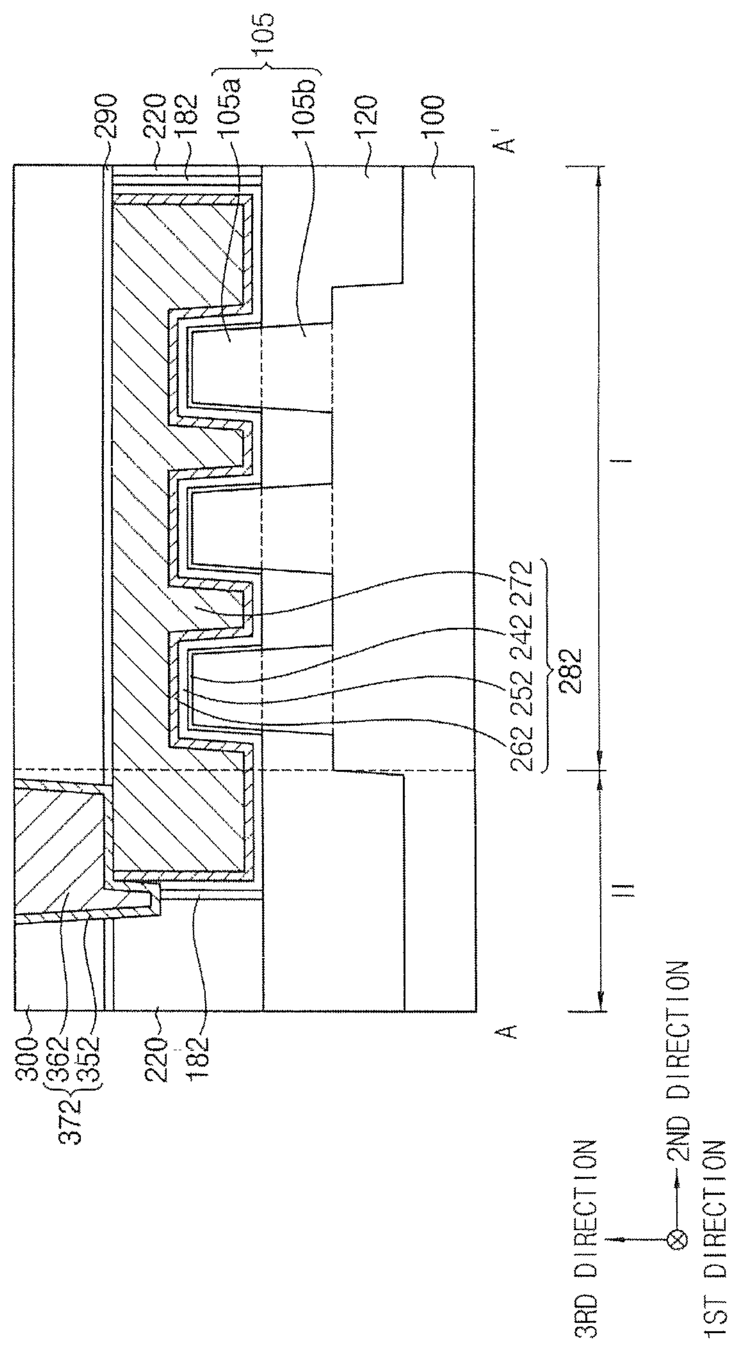
Figure 30:
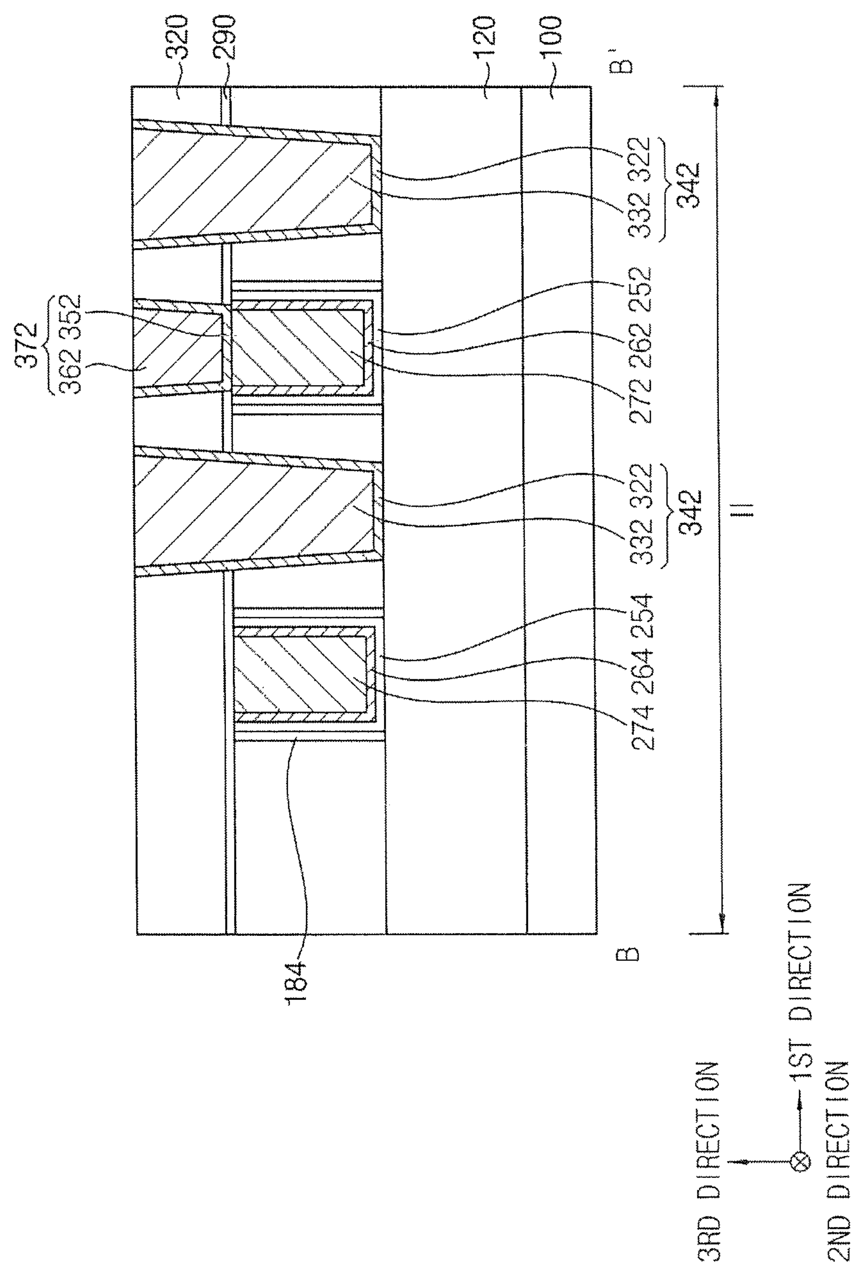
Figure 31:
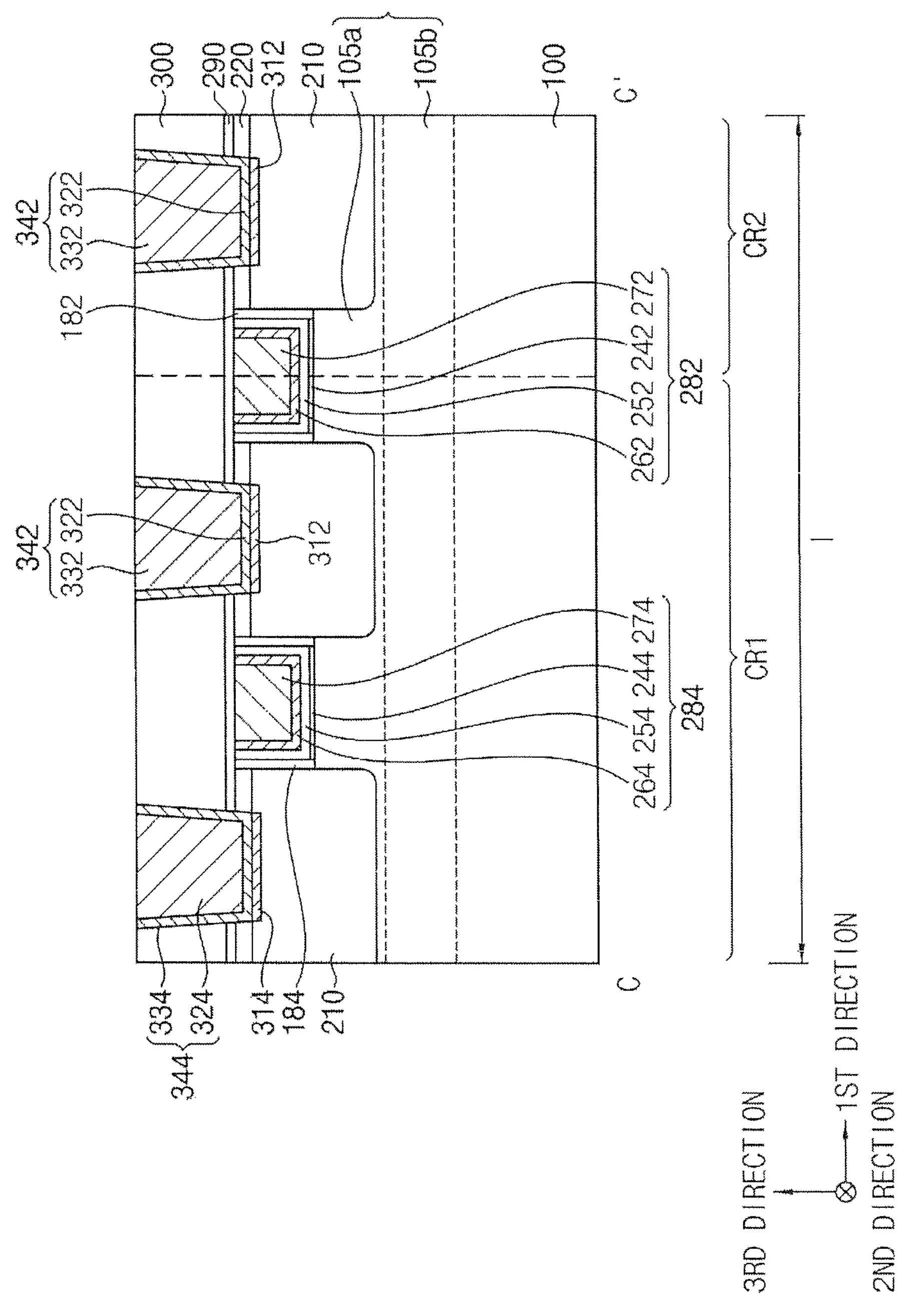
Figure 32:
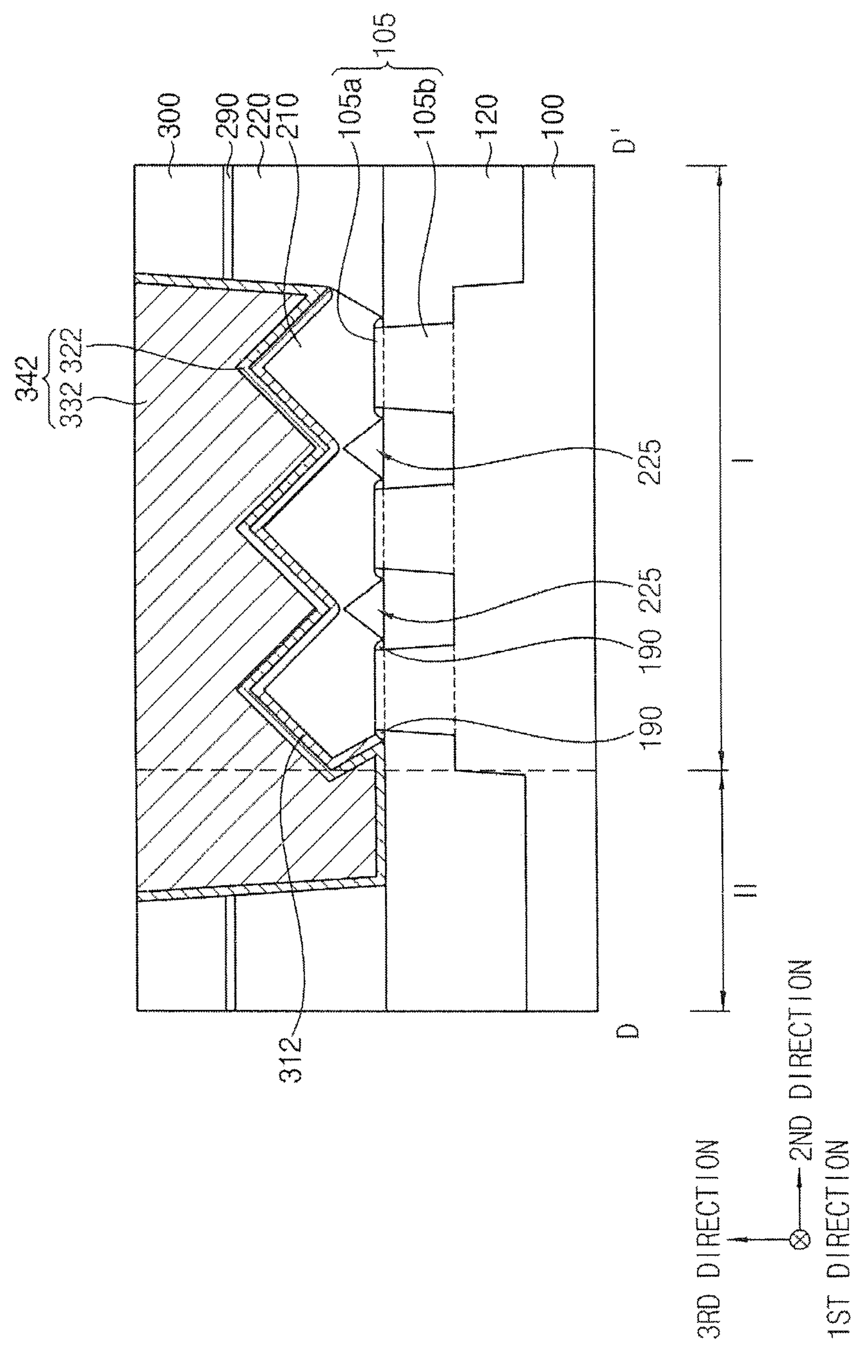
Figure 33:
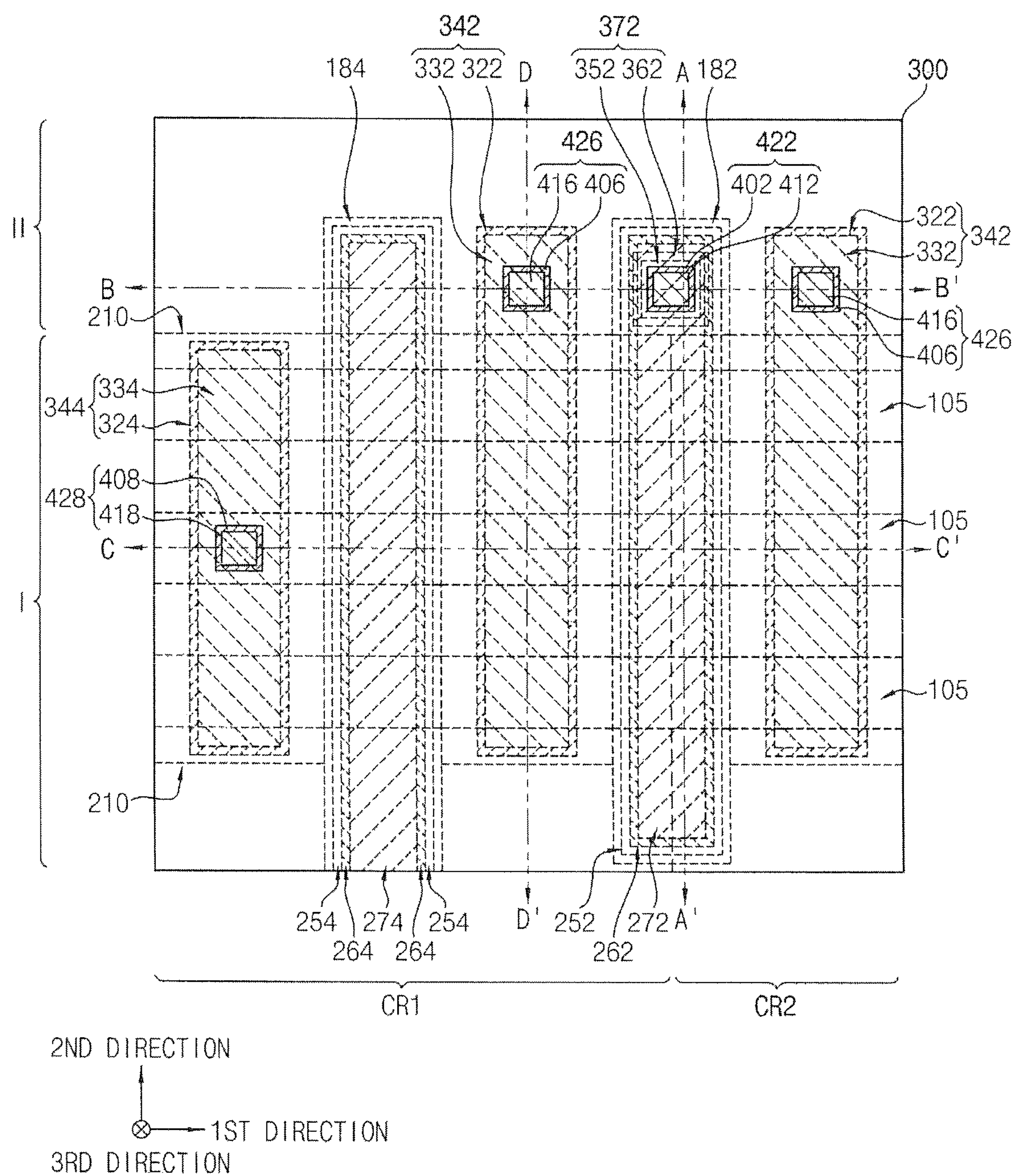
Figure 34:
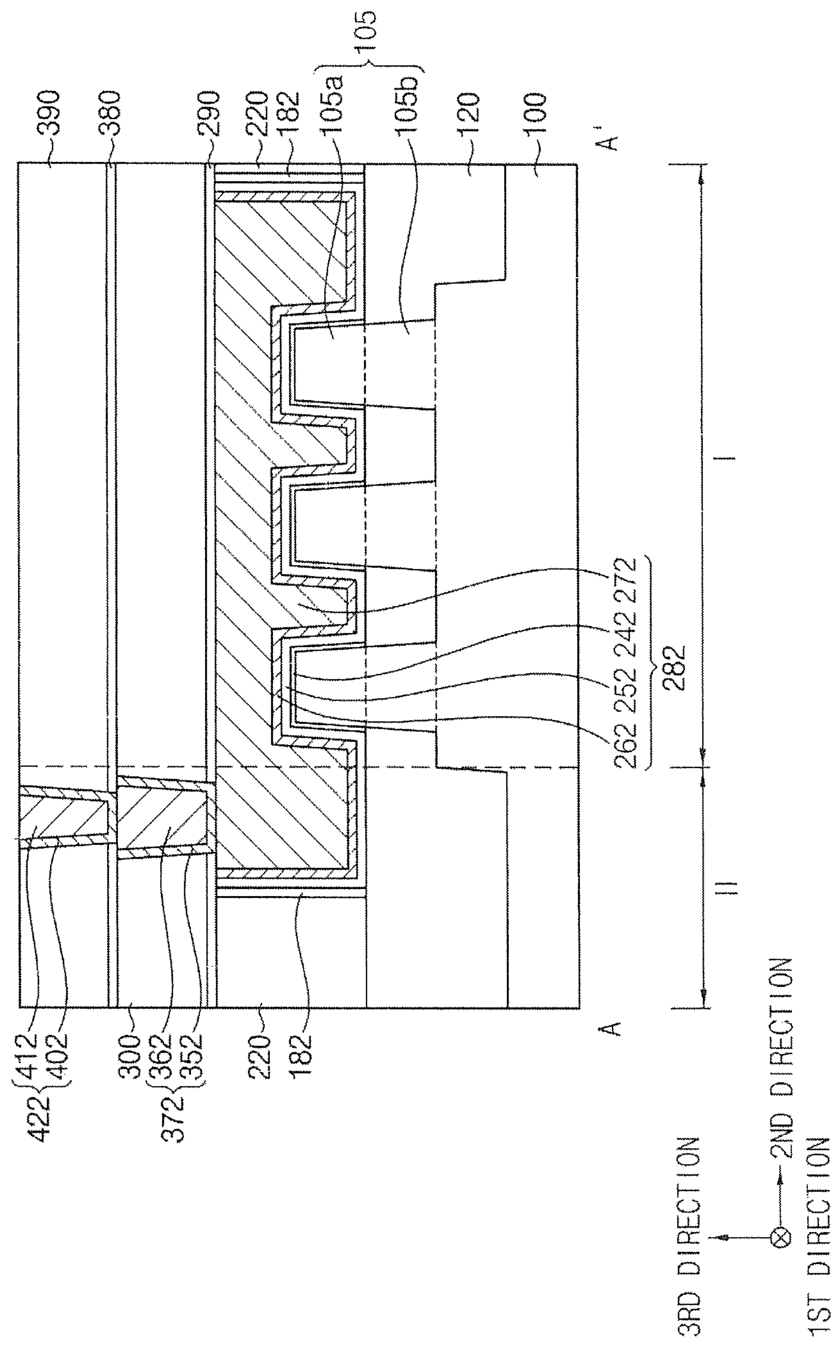
Figure 35:
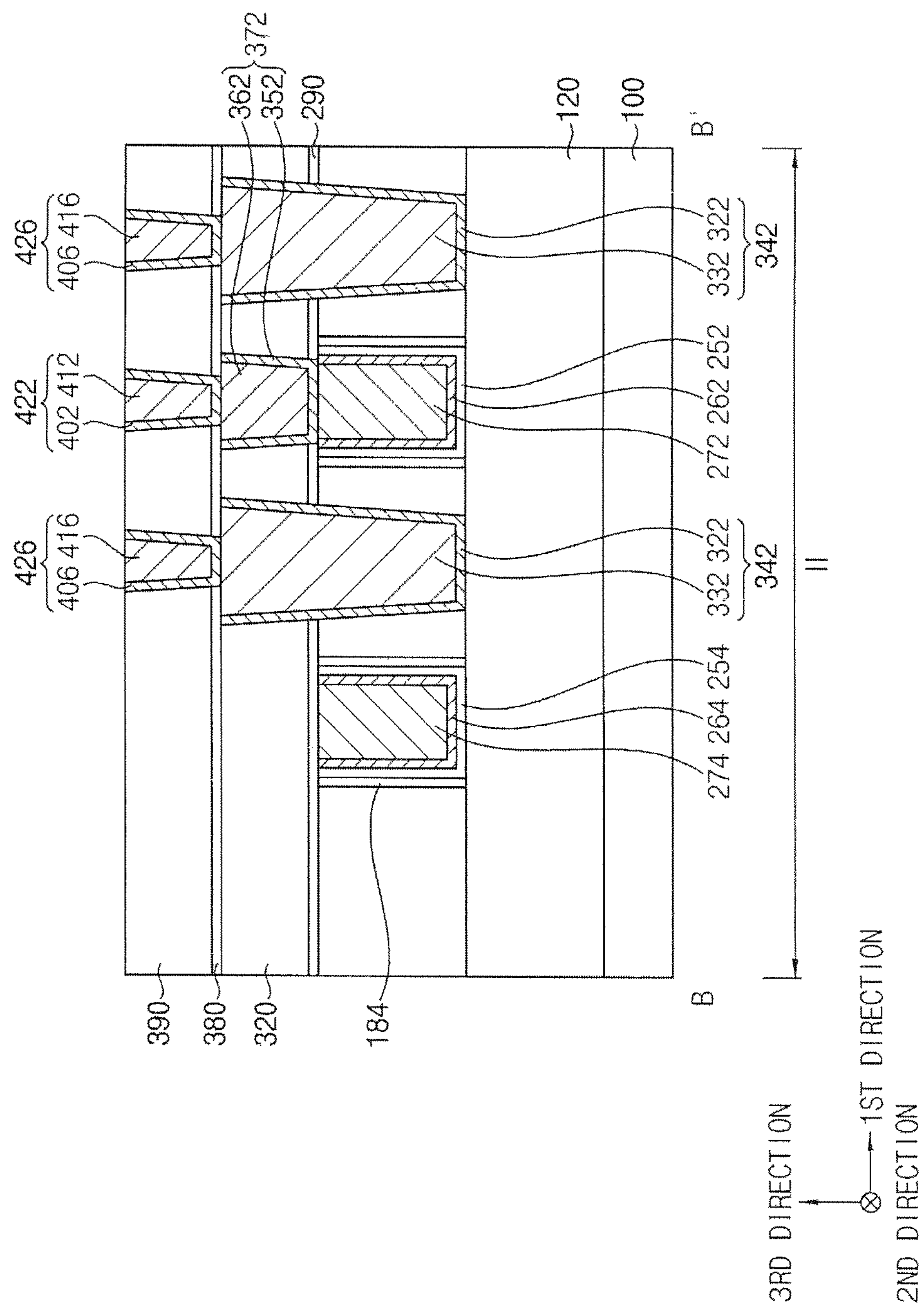
Figure 36:
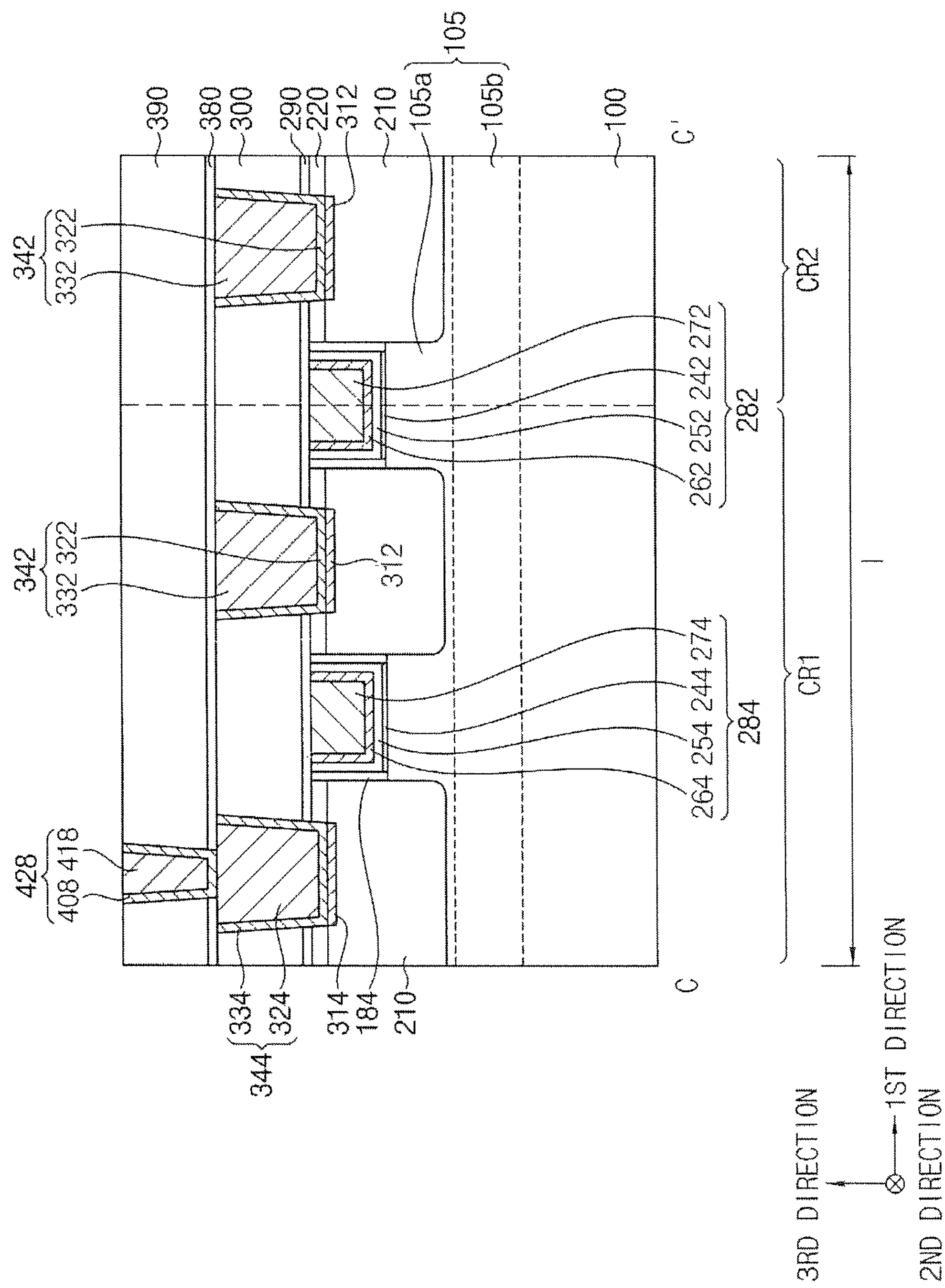
Figure 37:
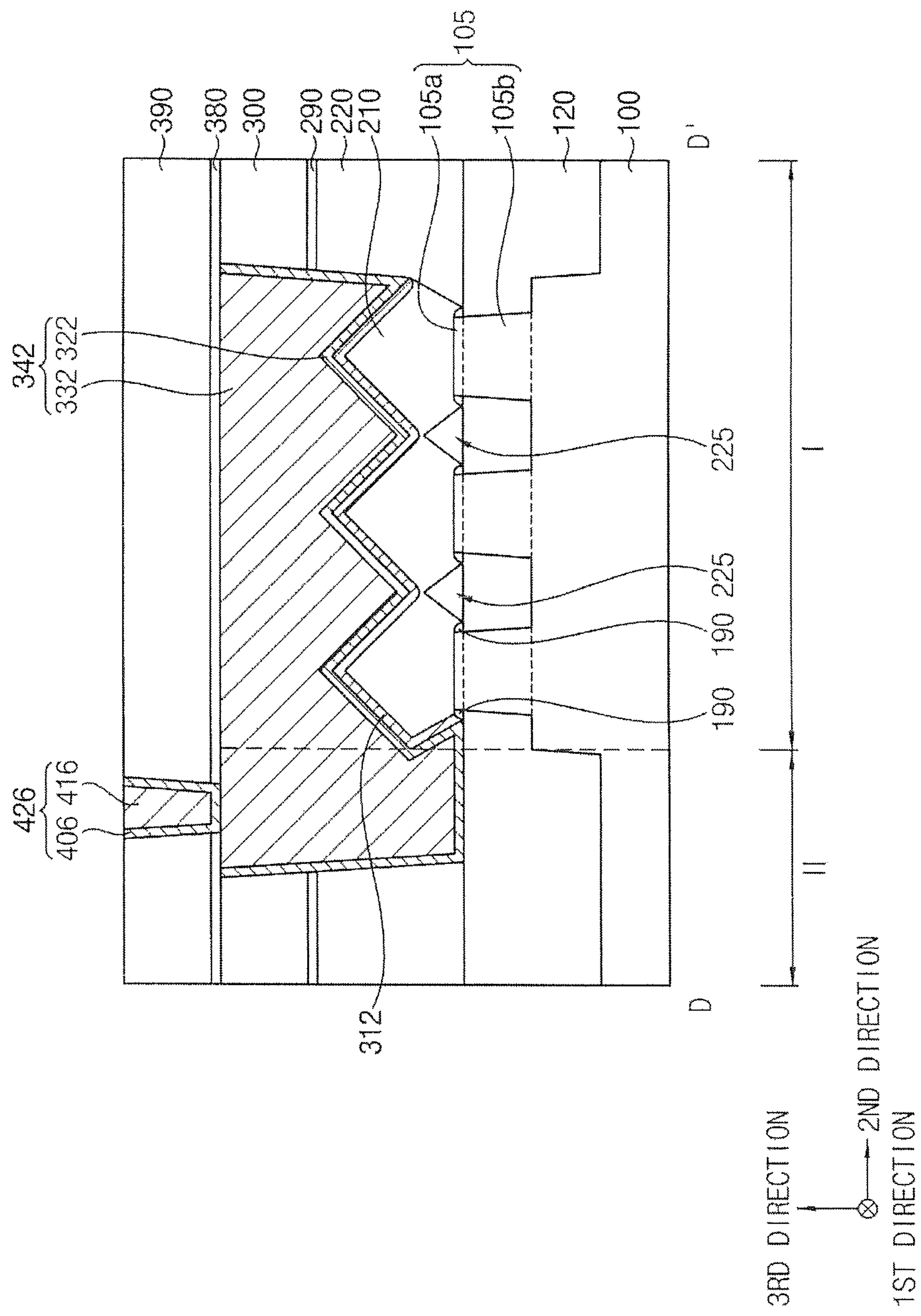

Referring to FIG. 29B, the fifth opening may expose not only an upper surface of a portion of the first gate structure 282 in the second region II but also a sidewall of an end of the first gate structure 282 in the second direction. Thus, the first contact plug 372 may contact the sidewall of the end of the first gate structure 282 in the second region II.

In some embodiments, each of the first to fourth contact plugs 372, 374, 342 and 344 may be formed by forming a barrier layer on bottoms and sidewalls of the third to sixth openings and an upper surface of the second insulating interlayer 300, forming a conductive layer on the barrier layer to fill the third to sixth openings, and planarizing the conductive layer and the barrier layer until the upper surface of the second insulating interlayer 300. Thus, each of the first to fourth contact plugs 372, 374, 342 and 344 may include a conductive pattern and a barrier pattern covering a bottom and a sidewall of the conductive pattern.

Particularly, the first contact plug 372 may include a first barrier pattern 352 and a first conductive pattern 362 sequentially stacked, the second contact plug 374 may include a second barrier pattern (not shown) and a second conductive pattern (not shown) sequentially stacked, the third contact plug 342 may include a third barrier pattern 322 and a third conductive pattern 332 sequentially stacked, and the fourth contact plug 344 may include a fourth barrier pattern 324 and a fourth conductive pattern 334 sequentially stacked.

In the figures, each of the third and fourth contact plugs 342 and 344 contacts a central upper surface of the impurity layer 210 in the first direction, however, the inventive concept may not be limited thereto. In some embodiments, each of the third and fourth contact plugs 342 and 344 may be self-aligned with the first and second gate spacers 182 and 184 on sidewalls of the first and second gate structures 282 and 284, respectively, or may be self-aligned with the second gate spacers 184 on sidewalls of the second gate structures 284, respectively.

Referring to FIGS. 33 to 37 together with FIG. 1B, an etch stop layer 380 and a third insulating interlayer 390 may be sequentially formed on the second insulating interlayer 300 and the first to fourth contact plugs 372, 374, 342 and 344, and first to fourth vias 422, 424, 426 and 428 may be formed through the third insulating interlayer 390 and the etch stop layer 620 to contact the first to fourth contact plugs 372, 374, 342 and 344, respectively.

The first and third vias 422 and 426 may be formed in the second region II, and the second and fourth vias 424 and 428 may be formed in the first region I.

In some embodiments, the first to fourth vias 422, 424, 426 and 428 may be formed by forming seventh to tenth openings (not shown) through the etch stop layer 380 and the third insulating interlayer 390 to expose upper surfaces of the first to fourth contact plugs 372, 374, 342 and 344, respectively, forming a barrier layer on bottoms and sidewalls of the seventh to tenth openings and an upper surface of the third insulating interlayer 390, forming a conductive layer on the barrier layer to fill the seventh to tenth openings, and planarizing the conductive layer and the barrier layer until the upper surface of the third insulating interlayer 390 may be exposed. Thus, each of the first to fourth vias 422, 424, 426 and 428 may include a conductive pattern and a barrier pattern covering a bottom and a sidewall of the conductive pattern.

Particularly, The first via 422 may include a fifth barrier pattern 402 and a fifth conductive pattern 412 sequentially stacked, the second via 424 may include a sixth barrier pattern (not shown) and a sixth conductive pattern (not shown) sequentially stacked, the third via 426 may include a seventh barrier pattern 406 and a seventh conductive pattern 416 sequentially stacked, and the fourth via 428 may include an eighth barrier pattern 408 and an eighth conductive pattern 418 sequentially stacked.

Referring again to FIGS. 1A to 6, a fourth insulating interlayer 430 may be formed on the third insulating interlayer 390 and the first to fourth vias 422, 424, 426 and 428, and a power rail 462 extending through the fourth insulating interlayer 430 to contact upper surfaces of the first and third vias 422 and 426 and a wiring 464 extending through the fourth insulating interlayer 430 to contact an upper surface of the second via 424 or the fourth via 428 may be formed.

The power rail 462 and the wiring 464 may be formed by forming an eleventh opening (not shown) extending through the fourth insulating interlayer 430 to commonly expose the upper surfaces of the first and third vias 422 and 426 and a twelfth opening (not shown) extending through the fourth insulating interlayer 430 to expose the upper surface of the second via 424 or the fourth via 428, forming a barrier layer on bottoms and sidewalls of the eleventh and twelfth openings and an upper surface of the fourth insulating interlayer 430, forming a conductive layer on the barrier layer to fill the eleventh and twelfth openings, and planarizing the conductive layer and the barrier layer until the upper surface of the fourth insulating interlayer 430 may be exposed. Thus, each of the power rail 462 and the wiring 464 may include a conductive pattern and a barrier pattern covering a bottom and a sidewall of the conductive pattern.

Particularly, the power rail 462 may include a ninth barrier pattern 442 and a ninth conductive pattern 452 sequentially stacked, and the wiring 464 may include a tenth barrier pattern 444 and a tenth conductive pattern 454 sequentially stacked.

In some embodiments, the power rail 462 may extend in the first direction in the second region II, and the wiring 464 may extend in the first direction in the first region I.

A fifth insulating interlayer (not shown) and upper wirings (not shown) may be further formed on the fourth insulating interlayer 430, the power rail 462 and the wiring 464 to complete the fabrication of the semiconductor device.

Figure 38:
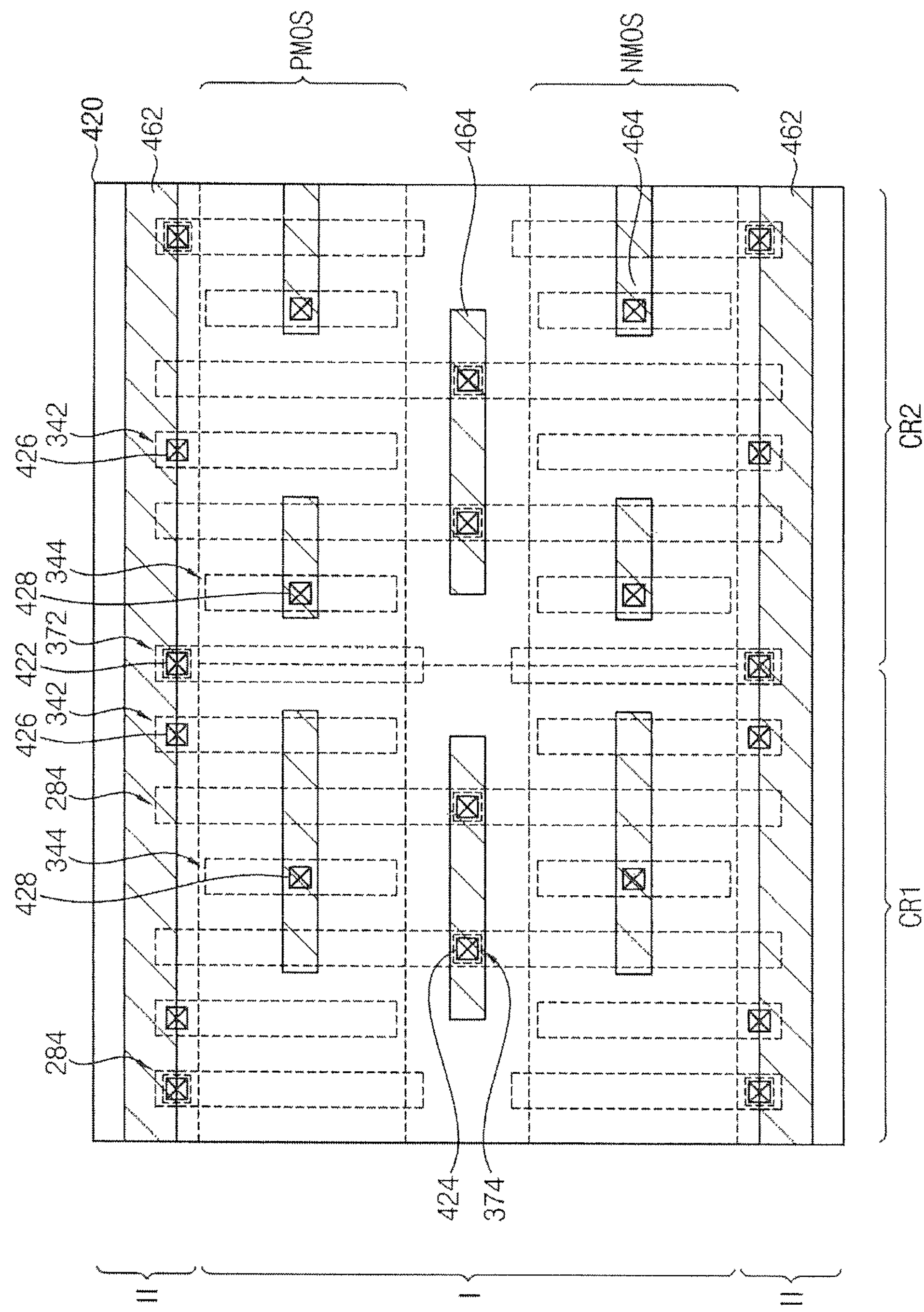
FIGS. 38 and 39 are plan views illustrating semiconductor devices in accordance with some embodiments of the present inventive concept.
Figure 39:
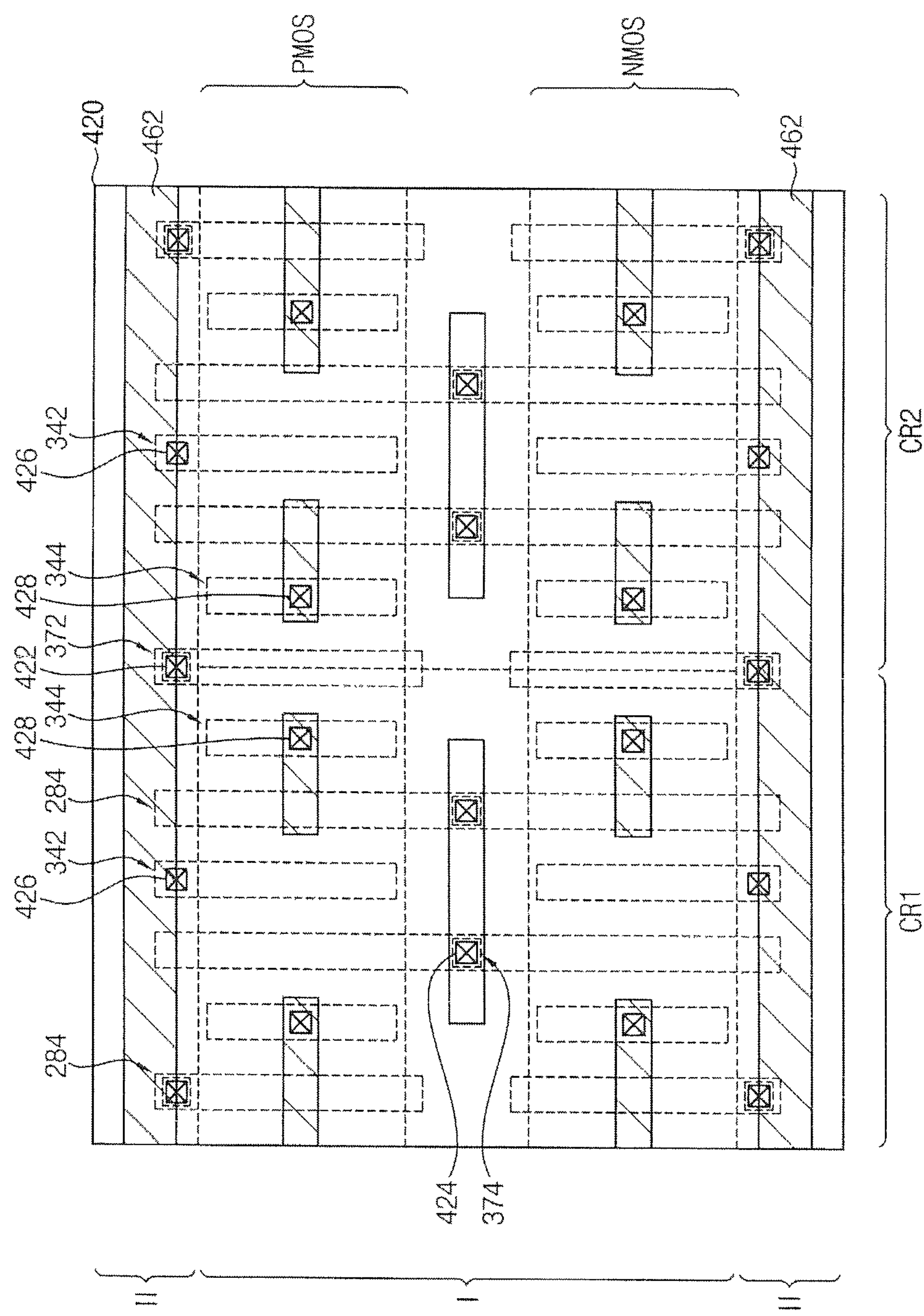

FIGS. 38 and 39 are plan views illustrating semiconductor devices in accordance with some embodiments. These semiconductor devices may be substantially the same as or similar to that illustrated with reference to FIGS. 1A to 6, except for the third and fourth contact plugs and the third and fourth vias. Thus, like reference numerals refer to like elements, and detailed descriptions thereon may be omitted below in the interest of brevity.

Referring to FIG. 38, the third and fourth contact plugs 342 and 344 may be formed in the first and second cell regions CR1 and CR2 adjacent the first gate structure 282, and thus the third and fourth vias 426 and 428 may be formed on the third and fourth contact plugs 342 and 344, respectively. In other words, the impurity layers 210 serving as a source region and a drain region, respectively, may be forming at opposite sides of the first gate structure 282.

In the semiconductor device of FIGS. 1A to 6, the third contact plug 342 may be formed in each of the first and second cell regions CR1 and CR2 adjacent the first gate structure 282, and the impurity layers 210 each serving as a source region may be formed at opposite sides of the first gate structure 282.

Referring to FIG. 39, the fourth contact plug 344 may be formed in each of the first and second cell regions CR1 and CR2 adjacent the first gate structure 282, and thus the fourth via 428 may be formed on the fourth contact plug 344. In other words, the impurity layers 210 each serving as a drain region may be formed at opposite sides of the first gate structure 282.

Figure 40:
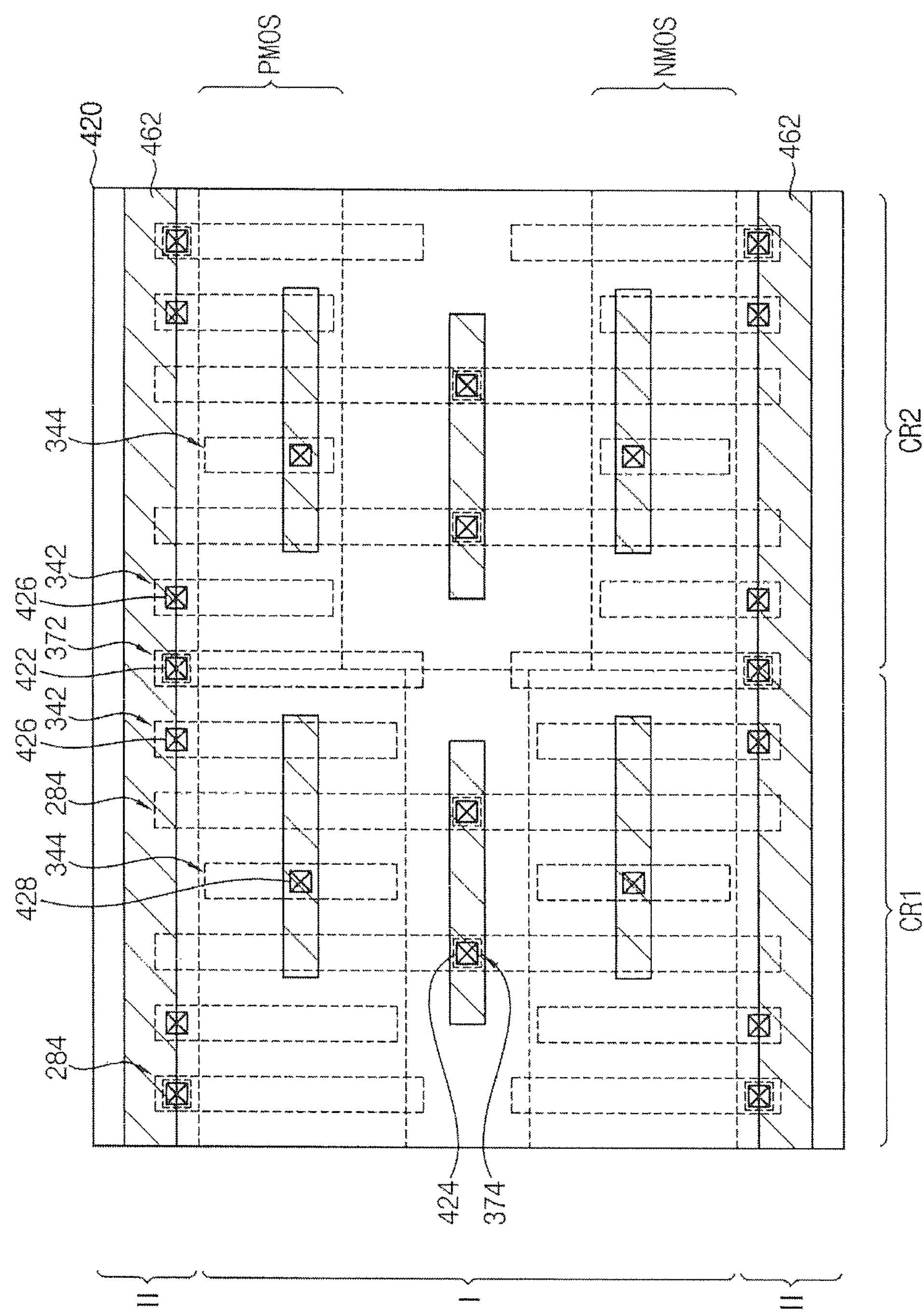
FIG. 40 is a plan view illustrating semiconductor devices in accordance with some embodiments of the present inventive concept.

FIG. 40 is a plan view illustrating semiconductor devices in accordance with some embodiments. This semiconductor device may be substantially the same as or similar to that illustrated with reference to FIGS. 1A to 6, except for the active fins. Thus, like reference numerals refer to like elements, and detailed descriptions thereon may be omitted below in the interest of brevity.

Referring to FIG. 40, each of the PMOS and NMOS regions in the second cell region CR2 of the first region I may include two active fins 105.

In other words, each of the PMOS and NMOS regions of the second cell region CR2 may include the different number of active fins 105 from that of each of the PMOS and NMOS regions of the first cell region CR1.

The above semiconductor device may be applied to various types of memory devices including a power rail. For example, the semiconductor device may be applied to a power rail of logic devices such as central processing units (CPUs), main processing units (MPUs), or application processors (APs), or the like. Additionally, the semiconductor device may be applied to a power rail of volatile memory devices such as DRAM devices or SRAM devices, or wiring structures of non-volatile memory devices such as flash memory devices, PRAM devices, MRAM devices, RRAM devices, or the like.

The foregoing is illustrative of some embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
- a substrate including a first cell region and a second cell region and a power rail region, the first and second cell regions being disposed in a first direction, and the power rail region being connected to each of opposite ends of the first and second cell regions in a second direction substantially perpendicular to the first direction;
- a first gate structure extending in the second direction on the substrate from a boundary area between the first and second cell regions to the power rail region;
- a first contact plug on the power rail region of the substrate, the first contact plug contacting an upper surface of the first gate structure;
- a power rail extending in the first direction on the power rail region of the substrate, the power rail being electrically connected to the first contact plug and supplying a turn-off signal to the first gate structure through the first contact plug so as to electrically insulate the first and second cell regions from each other; and
- an active fin continuously extending in the first direction on the substrate from at least a portion of the first cell region to at least a portion of the second cell region,
- wherein the first gate structure is disposed on the active fin, and
- wherein:
- the active fin includes:
  - a first portion under the first gate structure and an area adjacent thereto on the first cell region; and
  - a second portion under the first gate structure and an area adjacent thereto on the second cell region,
- the first and second portions of the active fin are electrically insulated from each other, and
- the semiconductor device further comprises:
  - a second contact plug on the first portion of the active fin on the first cell region and the power rail region;
  - a third contact plug on the second portion of the active fin on the second cell region and the power rail region;
  - a first via on the power rail region, the first via contacting an upper surface of the first contact plug and a lower surface of the power rail;
  - a second via on the power rail region, the second via contacting an upper surface of the second contact plug and the lower surface of the power rail; and
  - a third via on the power rail region, the third via contacting an upper surface of the third contact plug and the lower surface of the power rail, and
  - the first, second, and third vias are aligned with each other in the first direction.

2. The semiconductor device of claim 1, further comprising:
- a first impurity layer on the first portion of the active fin; and
- a second impurity layer on the second portion of the active fin,
- wherein the second contact plug contacts an upper surface of the first impurity layer, and the third contact plug contacts an upper surface of the second impurity layer.

3. The semiconductor device of claim 2, further comprising:
- a second gate structure spaced apart from the first gate structure in the first direction on the first cell region, the second gate structure being adjacent the first impurity layer in the first direction; and
- a third gate structure spaced apart from the first gate structure in the first direction on the second cell region, the third gate structure being adjacent the second impurity layer in the first direction,
- wherein the first impurity layer serves as a source region of a first transistor including the second gate structure, and the second impurity layer serves as a drain region of a second transistor including the third gate structure.

4. The semiconductor device of claim 2, wherein each of the first and second impurity layers includes silicon-germanium doped with p-type impurities.

5. The semiconductor device of claim 4, wherein the power rail supplies a plus voltage to the first gate structure.

6. The semiconductor device of claim 2, wherein each of the first and second impurity layers includes silicon doped with n-type impurities or silicon carbide doped with n-type impurities.

7. The semiconductor device of claim 1, wherein the first contact plug contacts a sidewall of an end of the first gate structure on the power rail region.

8. The semiconductor device of claim 2, wherein the second contact plug contacts a sidewall of the first impurity layer in the second direction, and the third contact plug contacts a sidewall of the second impurity layer in the second direction.

9. The semiconductor device of claim 3, further comprising:
- a third portion under the second gate structure and an area adjacent thereto on the first cell region;
- a third impurity layer on the third portion of the active fin;
- a fourth contact plug on the first cell region, the fourth contact plug contacting an upper surface of the third impurity layer; and
- a first wiring on the first cell region, the first wiring being electrically connected to the fourth contact plug.

10. The semiconductor device of claim 9, further comprising:
- a fourth portion under the third gate structure and an area adjacent thereto on the second cell region;
- a fourth impurity layer on the fourth portion of the active fin;

a fifth contact plug on the second cell region, the fifth contact plug contacting an upper surface of the fourth impurity layer; and a second wiring on the second cell region, the second wiring being electrically connected to the fifth contact plug.

11. A semiconductor device, comprising:

a substrate including a first cell region and a second cell region and a power rail region, the first and second cell regions being disposed in a first direction, and the power rail region being connected to each of opposite ends of the first and second cell regions in a second direction substantially perpendicular to the first direction;

an active fin continuously extending in the first direction on the substrate from at least a portion of the first cell region to at least a portion of the second cell region, the active fin including:

a first portion on the first cell region; and a second portion on the second cell region, wherein the first and second portions of the active fin are electrically insulated from each other;

a first gate structure extending in the second direction on the substrate from a boundary area between the first and second cell regions to the power rail region;

a first contact plug on the power rail region of the substrate, the first contact plug contacting an upper surface of the first gate structure; and a power rail extending in the first direction on the power rail region of the substrate, the power rail being electrically connected to the first contact plug, wherein:

the power rail supplies a turn-off signal to the first gate structure through the first contact plug so as to electrically insulate the first and second portions of the active fin from each other, and the semiconductor device further comprises:

a second contact plug on the first portion of the active fin on the first cell region and the power rail region;

a third contact plug on the second portion of the active fin on the second cell region and the power rail region;

a first via on the power rail region, the first via contacting an upper surface of the first contact plug and a lower surface of the power rail;

a second via on the power rail region, the second via contacting an upper surface of the second contact plug and the lower surface of the power rail; and a third via on the power rail region, the third via contacting an upper surface of the third contact plug and the lower surface of the power rail, and the first, second, and third vias are aligned with each other in the first direction.

12. The semiconductor device of claim 11, further comprising:

a first impurity layer on the first portion of the active fin; and a second impurity layer on the second portion of the active fin, wherein the second contact plug contacts an upper surface of the first impurity layer, and the third contact plug contacts an upper surface of the second impurity layer.

13. The semiconductor device of claim 12, further comprising:

a second gate structure spaced apart from the first gate structure in the first direction on the first cell region, the second gate structure being adjacent the first impurity layer in the first direction; and a third gate structure spaced apart from the first gate structure in the first direction on the second cell region, the third gate structure being adjacent the second impurity layer in the first direction, wherein the first impurity layer serves as a source region of a first transistor including the second gate structure, and the second impurity layer serves as a drain region of a second transistor including the third gate structure.

14. The semiconductor device of claim 13, further comprising:

a third portion under the second gate structure and an area adjacent thereto on the first cell region;

a third impurity layer on the third portion of the active fin;

a fourth contact plug on the first cell region, the fourth contact plug contacting an upper surface of the third impurity layer; and a wiring on the first cell region, the wiring being electrically connected to the fourth contact plug.

15. A semiconductor device, comprising:

a substrate including a first power rail region and a second power rail region and a first cell region and a second cell region, each of the first and second power rail regions extending in a first direction, the first and second power rail regions being spaced apart from each other in a second direction substantially perpendicular to the first direction, and the first and second cell regions being disposed between the first and second power rail regions and contacting each other in the first direction;

a first gate structure and a second gate structure spaced apart from each other, each of the first and second gate structures extending in the second direction on the substrate from a boundary area between the first and second cell regions to the first and second power rail regions, respectively;

a first contact plug and a second contact plug on the first and second power rail regions, respectively, of the substrate, the first and second contact plugs contacting upper surfaces of the first and second gate structures, respectively;

a first power rail extending in the first direction on the first power rail region of the substrate, the first power rail being electrically connected to the first contact plug and supplying a plus voltage to the first gate structure through the first contact plug;

a second power rail extending in the first direction on the second power rail region of the substrate, the second power rail being electrically connected to the second contact plug and supplying a ground voltage or a minus voltage to the second gate structure through the second contact plug; and an active fin continuously extending in the first direction on the substrate from at least a portion of the first cell region to at least a portion of the second cell region, wherein the first gate structure is disposed on the active fin, and wherein:

the active fin includes:

a first portion under the first gate structure and an area adjacent thereto on the first cell region; and a second portion under the first gate structure and an area adjacent thereto on the second cell region, the first and second portions of the active fin are electrically insulated from each other, the first and second cell regions are electrically insulated from each other, and the semiconductor device further comprises:

a third contact plug on the first portion of the active fin on the first cell region and the first power rail region;

a fourth contact plug on the second portion of the active fin on the second cell region and the first power rail region;

a first via on the first power rail region, the first via contacting an upper surface of the first contact plug and a lower surface of the first power rail;

a second via on the first power rail region, the second via contacting an upper surface of the third contact plug and the lower surface of the first power rail; and a third via on the first power rail region, the third via contacting an upper surface of the fourth contact plug and the lower surface of the first power rail, and the first, second, and third vias are aligned with each other in the first direction.

16. The semiconductor device of claim 15, wherein the first and second cell regions include PMOS and NMOS regions, respectively, the PMOS and NMOS regions being adjacent the first and second power rail regions, respectively, and being spaced apart from each other in the second direction, and wherein the first and second gate structures are disposed on the PMOS and NMOS regions, respectively.

17. The semiconductor device of claim 15, further comprising:

a fifth contact plug on the first portion of the active fin on the first cell region and the second power rail region;

a sixth contact plug on the second portion of the active fin on the second cell region and the second power rail region;

a fourth via on the second power rail region, the fourth via contacting an upper surface of the second contact plug and a lower surface of the second power rail;

a fifth via on the second power rail region, the fifth via contacting an upper surface of the fifth contact plug and the lower surface of the second power rail; and a sixth via on the second power rail region, the sixth via contacting an upper surface of the sixth contact plug and the lower surface of the second power rail, and the fourth to sixth vias are aligned with each other in the first direction.

* * * * *